(12) United States Patent
Cheung et al.

(10) Patent No.: US 7,220,985 B2
(45) Date of Patent: May 22, 2007

(54) SELF ALIGNED MEMORY ELEMENT AND WORDLINE

(75) Inventors: Patrick K. Cheung, Sunnyvale, CA (US); Ashok M. Khathuria, San Jose, CA (US)

(73) Assignee: Spansion, LLC, Sunnyvale, CA (US)

( * ) Notice: Subject to any disclaimer, the term of this patent is extended or adjusted under 35 U.S.C. 154(b) by 22 days.

(21) Appl. No.: 10/314,591

(22) Filed: Dec. 9, 2002

(65) Prior Publication Data

US 2004/0108501 A1 Jun. 10, 2004

(51) Int. Cl.
| H01L 21/00 | (2006.01) |
| H01L 29/08 | (2006.01) |
| H01L 35/24 | (2006.01) |
| H01L 51/00 | (2006.01) |

(52) U.S. Cl. .......................................... 257/40; 438/82
(58) Field of Classification Search ................... 257/40; 438/82
See application file for complete search history.

(56) References Cited

U.S. PATENT DOCUMENTS

| 4,052,209 | A | | 10/1977 | Huffman et al. |
| 4,860,254 | A | * | 8/1989 | Pott et al. ..................... 365/145 |
| 5,272,359 | A | | 12/1993 | Nagasubramanian et al. |
| 5,792,694 | A | | 8/1998 | Park |
| 6,055,180 | A | | 4/2000 | Gudesen et al. |
| 6,060,333 | A | | 5/2000 | Tanaka et al. |
| 6,077,716 | A | | 6/2000 | Yoo |
| 6,136,643 | A | * | 10/2000 | Jeng et al. ..................... 438/253 |
| 6,458,474 | B1 | | 10/2002 | Okada et al. |
| 6,815,781 | B2 | * | 11/2004 | Vyvoda et al. ............... 257/377 |
| 2003/0179617 | A1 | * | 9/2003 | Gudesen et al. ............. 365/200 |
| 2004/0102039 | A1 | * | 5/2004 | Lim et al. ..................... 438/674 |
| 2004/0217347 | A1 | * | 11/2004 | Tripsas et al. ................ 257/40 |
| 2005/0054138 | A1 | * | 3/2005 | Hsu et al. ...................... 438/59 |

FOREIGN PATENT DOCUMENTS

WO    WO 02/37500 A1    5/2002

OTHER PUBLICATIONS

International Search Report, PCT/US03/28023, mailed Jul. 14, 2004.

* cited by examiner

*Primary Examiner*—Kenneth Parker
*Assistant Examiner*—Jesse A. Fenty
(74) *Attorney, Agent, or Firm*—Amin, Turocy & Calvin, LLP

(57) ABSTRACT

An organic polymer memory cell is provided having an organic polymer layer and an electrode layer formed over a first conductive (e.g., copper) layer (e.g., bitline). The memory cells are connected to a second conductive layer (e.g., forming a wordline), and more particularly the top of the electrode layer of the memory cells to the second conductive layer. Optionally, a conductivity facilitating layer is formed over the conductive layer. Dielectric material separates the memory cells. The memory cells are self-aligned with the bitlines formed in the first conductive layer and the wordlines formed in the second conductive layer.

13 Claims, 20 Drawing Sheets

SELF ALIGNED MEMORY ELEMENT AND WORDLINE

FIELD OF INVENTION

The present invention relates generally to organic memory devices and, in particular, to forming self aligned memory elements and wordlines.

BACKGROUND OF THE INVENTION

The volume, use and complexity of computers and electronic devices are continually increasing. Computers consistently become more powerful and new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage media such as, for example, hard disk drives, compact disk drives and corresponding media, digital video disk (DVD) drives, and the like. The long term storage media typically store larger amounts of information at a lower cost, but are slower than other types of storage devices. Storage devices also include memory devices which are often, but not always, short term storage media. Short term memory devices tend to be substantially faster than long term storage media. Such short term memory devices include, for example, dynamic random access memory (DRAM), static random access memory (SRAM), double data rate memory (DDR), fast page mode dynamic random access memory (FPMDRAM), extended data-out dynamic random access memory (EDO-DRAM), synchronous dynamic random access memory (SDRAM), VideoRAM (VRAM), flash memory, read only memory (ROM), and the like.

Memory devices can be subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), electrically erasable programmable read only memory (EEPROM), flash EEPROM and the like. Volatile memory devices generally provide faster operation at a lower cost as compared to non-volatile memory devices.

Memory devices generally include arrays of memory cells. Each memory cell can be accessed or "read", "written", and "erased" with information. The memory cells maintain information in an "off" or an "on" state, also referred to as "0" and "1" Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. A common semiconductor device employed in memory devices is the metal oxide semiconductor field effect transistor (MOSFET).

The use of portable computer and electronic devices has greatly increased demand for memory devices. Digital cameras, digital audio players, personal digital assistants, and the like generally seek to employ large capacity memory devices (e.g., flash memory, smart media, compact flash, . . . ). The increased demand for information storage is commensurate with memory devices having an ever increasing storage capacity (e.g., increase storage per die or chip). A postage-stamp-sized piece of silicon may, for example, contain tens of millions of transistors, each transistor as small as a few hundred nanometers. However, silicon-based devices are approaching their fundamental physical size limits. Inorganic solid-state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as the size of inorganic solid-state devices decreases and integration increases, sensitivity to alignment tolerances increases making fabrication markedly more difficult. Formation of features at small minimum sizes does not imply that the minimum size can be used for fabrication of working circuits. It is necessary to have alignment tolerances which are much smaller than the small minimum size, for example, one quarter the minimum size.

Scaling inorganic solid-state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely.

Applying a voltage across a semiconductor junction (in the reverse-bias direction) creates a depletion region around the junction. The width of the depletion region depends on the doping levels of the semiconductor. If the depletion region spreads to contact another depletion region, punch-through or uncontrolled current flow, may occur.

Higher doping levels tend to minimize the separations required to prevent punch-through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversibly degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge. Thus, further device shrinking and density increasing may be limited for inorganic memory devices. Furthermore, such device shrinkage for inorganic non-volatile memory devices while meeting increased performance demands is particularly difficult, especially while maintaining low costs.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is merely to present some concepts of the invention in a simplified form as a prelude to the more detailed description that is presented later.

In accordance with an aspect of the present invention, an organic polymer memory cells include an organic polymer layer and an electrode layer formed over a first conductive (e.g., copper) layer (e.g., bitline). The memory cells are connected to a second conductive layer (e.g., forming a wordline), and more particularly the top of the electrode layer of the memory cells to the second conductive layer. Optionally, a conductivity facilitating layer is formed over the first conductive layer. Dielectric material separates the memory cells. The memory cells are self-aligned with the bitlines formed in the first conductive layer and the wordlines formed in the second conductive layer.

The organic polymer layer and conductivity facilitating layer can be collectively referred to as a selectively conductive media. The conductive properties of this media (e.g., conductive, non-conductive, semi-conductive) can be modified in a controlled manner by applying various voltages across the media (e.g., via the electrode layer and the first conductive layer).

The organic polymer layer may be comprised of a conjugated organic material, such as a small organic molecule and a conjugated polymer. A polymer backbone of the conjugated organic polymer can extend lengthwise between the electrode layer and the first conductive layer (e.g., generally substantially perpendicular to the stack). The conjugated organic molecule can be linear or branched such that the backbone retains its conjugated nature. Such conjugated molecules characteristically have overlapping π orbitals and they can assume two or more resonant structures. The conjugated nature of the conjugated organic materials contributes to the controllably conductive properties of the selectively conductive media. Such conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The conductivity facilitating layer also has the ability to donate and accept charges (e.g., holes and/or electrons) and contributes to the controllably conductive properties of the selectively conductive media. Generally, the conductivity facilitating layer has at least two relatively stable oxidation-reduction states. The two relatively stable states permit the conductivity facilitating layer to donate and accept charges and electrically interact with the organic polymer layer. The particular conductivity facilitating layer employed is selected so that the two relatively stable states match with the two relatively stable states of the conjugated organic molecule of the organic polymer layer.

The conductivity facilitating layer is operative to facilitate charge transport between the electrode layer, first conductive layer and the second conductive layer (e.g., wordlines). Additionally, the conductivity facilitating layer facilitates charge carrier (e.g., electrons or holes) injection into the organic polymer layer and increases the concentration of the charge carrier in the polymer layer resulting in a modification of the conductivity of the organic polymer layer. Furthermore, the conductivity facilitating layer can also store opposite charges in order to balance the total charge of the memory cells.

The conductivity facilitating layer can in some instances act as a catalyst when forming the organic polymer layer. In this connection, the backbone of the conjugated organic molecule may initially form adjacent the conductivity facilitating layer, and grow or assemble away and substantially perpendicular to the conductivity facilitating layer surface. As a result, the backbones of the conjugated organic molecule may be self aligned in a direction that traverses the stack.

The memory cells can have two states, a conductive (low impedance or "on") state or non-conductive (high impedance or "off") state. The memory cells are also able to have/maintain a plurality of states, in contrast to a conventional memory device that is limited to two states (e.g., off or on). The memory cells can employ varying degrees of conductivity to identify additional states. For example, the memory cells can have a low impedance state, such as a very highly conductive state (very low impedance state), a highly conductive state (low impedance state), a conductive state (medium level impedance state), and a non-conductive state (high impedance state) thereby enabling the storage of multiple bits of information in a single memory cell, such as 2 or more bits of information or 4 or more bits of information (e.g., 4 states providing 2 bits of information, 8 states providing 3 bits of information . . . ).

During typical device operation, electrons flow from the electrode layer through the selectively conductive media to the first conductive layer (bitline) based on a voltage applied to the electrodes by the wordline if the polymer layer is n-type conductor. Alternately, holes flow from the electrode layer to the first conductive layer if the organic polymer layer is p-type conductor, or both electrons and holes flow in the polymer layer if it can be both n and p type with proper energy band match. As such, current flows from the electrode layer to the first conductive layer via the selectively conductive media.

To the accomplishment of the foregoing and related ends, certain illustrative aspects of the invention are described herein in connection with the following description and the drawings. These aspects are indicative, however, of but a few of the various ways in which the principles of the invention may be employed, and the present invention is intended to include all such aspects and their equivalents. It is to be appreciated that other objects, advantages and novel features of the invention will become apparent from the following detailed description of the invention when considered in conjunction with the drawings.

DETAILED DESCRIPTION OF THE INVENTION

Figure 1:
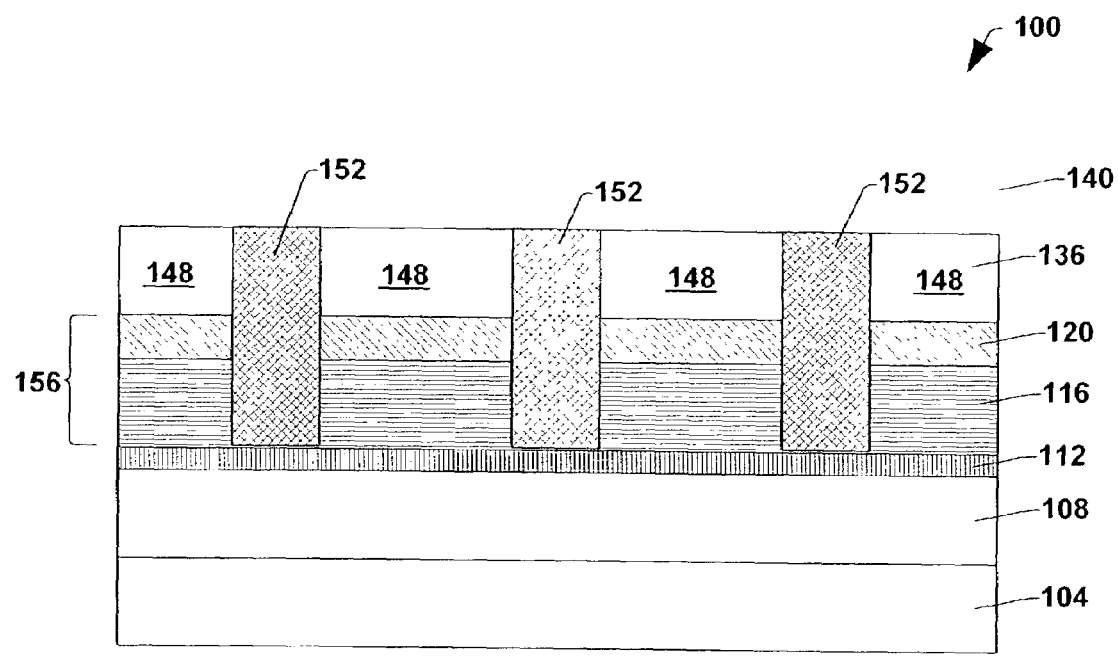
FIG. 1 is a schematic cross sectional illustration of a portion of a wafer depicting a memory cell formed thereon in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, to one skilled in the art that one or more aspects of the present invention may be practiced with a lesser degree of these specific details. In other instances, known structures and devices may be shown in block diagram form in order to facilitate describing one or more aspects of the present invention.

FIG. 1 illustrates a schematic cross sectional view of a portion of a wafer 100 whereon one or more multilayer organic polymer memory structures or cells 156 are formed in accordance with one or more aspects of the present invention. The organic polymer memory cells 156 include an organic polymer layer 116 and an electrode layer 120 formed over a first conductive (e.g., copper) layer 108 (e.g., bitline). The memory cells 156 are connected to a second conductive layer 136 (e.g., forming a wordline 148), and more particularly the top of the electrode layer 120 of the memory cells 156 to the second conductive layer 136. In the example illustrated, a conductivity facilitating layer 112 is formed over the first conductive layer 108. Dielectric material 152 separates the memory cells 156.

The organic polymer layer 116 and conductivity facilitating layer 112 can be collectively referred to as a selectively conductive media. The conductive properties of this media (e.g., conductive, non-conductive, semi-conductive) can be modified in a controlled manner by applying various voltages across the media (e.g., via the electrode layer 120 and the first conductive layer 108 (e.g., bitline)).

The organic polymer layer 116 may be comprised of a conjugated organic material, such as a small organic molecule and a conjugated polymer. A polymer backbone of the conjugated organic polymer can extend lengthwise between the electrode layer 120 and the first conductive layer 108 (e.g., generally substantially perpendicular to the stack). The conjugated organic molecule can be linear or branched such that the backbone retains its conjugated nature. Such conjugated molecules characteristically have overlapping π orbitals and they can assume two or more resonant structures. The conjugated nature of the conjugated organic materials contributes to the controllably conductive properties of the selectively conductive media. Such conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The conductivity facilitating layer 112 also has the ability to donate and accept charges (e.g., holes and/or electrons) and contributes to the controllably conductive properties of the selectively conductive media. Generally, the conductivity facilitating layer has at least two relatively stable oxidation-reduction states. The two relatively stable states permit the conductivity facilitating layer 112 to donate and accept charges and electrically interact with the organic polymer layer 116. The particular conductivity facilitating layer 112 employed is selected so that the two relatively stable states match with the two relatively stable states of the conjugated organic molecule of the organic polymer layer 116.

The conductivity facilitating layer 112 is operative to facilitate charge transport between the electrode layer 120, first conductive layer 108 and the second conductive layer 136 (e.g., wordlines 148). Additionally, the conductivity facilitating layer 112 facilitates charge carrier (e.g., electrons or holes) injection into the organic polymer layer 116 and increases the concentration of the charge carrier in the polymer layer resulting in a modification of the conductivity of the organic polymer layer 116. Furthermore, the conductivity facilitating layer 112 can also store opposite charges in order to balance the total charge of the memory cells 156.

The conductivity facilitating layer 112 can in some instances act as a catalyst when forming the organic polymer layer 116. In this connection, the backbone of the conjugated organic molecule may initially form adjacent the conductivity facilitating layer 112, and grow or assemble away and substantially perpendicular to the conductivity facilitating layer surface. As a result, the backbones of the conjugated organic molecule may be self aligned in a direction that traverses the stack.

The memory cells 156 can have two states, a conductive (low impedance or "on") state or non-conductive (high impedance or "off") state. The memory cells 156 are also able to have/maintain a plurality of states, in contrast to a conventional memory device that is limited to two states (e.g., off or on). The memory cells 156 can employ varying degrees of conductivity to identify additional states. For example, the memory cells 156 can have a low impedance state, such as a very highly conductive state (very low impedance state), a highly conductive state (low impedance state), a conductive state (medium level impedance state), and a non-conductive state (high impedance state) thereby enabling the storage of multiple bits of information in a single memory cell, such as 2 or more bits of information or 4 or more bits of information (e.g., 4 states providing 2 bits of information, 8 states providing 3 bits of information . . . ).

During typical device operation, electrons flow from the electrode layer 120 through the selectively conductive media to the first conductive layer 108 based on a voltage applied to the electrodes by the wordline 148 if the organic polymer layer 116 is n-type conductor. Alternately, holes flow from the electrode layer 120 to the first conductive layer 108 if the organic polymer layer 116 is p-type conductor, or both electrons and holes flow in the organic polymer layer 116 if it can be both n and p type with proper energy band match. As such, current flows from the electrode layer 120 to the first conductive layer 108 via the selectively conductive media.

Switching the memory cells 156 to a particular state is referred to as programming or writing. Programming is accomplished by applying a particular voltage (e.g., 9 volts, 2 volts, 1 volts, . . . ) across the selectively conductive media. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute the memory cells 156, the thickness of the various layers, and the like.

Generally speaking, the presence of an external stimuli such as an applied electric field that exceeds a threshold value ("on" state) permits an applied voltage to write, read, or erase information into/from the memory cells 156; whereas the absence of the external stimuli that exceeds a threshold value ("off" state) prevents an applied voltage to write or erase information into/from the memory cells 156.

To read information from the memory cells 156, a voltage or electric field (e.g., 2 volts, 1 volts, 0.5 volts) is applied. Then, an impedance measurement is performed which, therein determines which operating state one or more of the memory cells are in (e.g., high impedance, very low impedance, low impedance, medium impedance, and the like). As stated supra, the impedance relates to, for example, "on" (e.g., 1) or "off" (e.g., 0) for a dual state device or to "00", "10", "10", or "11" for a quad state device. It is appreciated that other numbers of states can provide other binary interpretations. To erase information written into the memory cells 156, a negative voltage or a polarity opposite the polarity of the writing signal that exceeds a threshold value can be applied.

In accordance with an aspect of the present invention, memory cells 156 are self-aligned with the bitlines 132 formed in the first conductive layer 108 and the wordlines 148 formed in the second conductive layer 136.

Figure 2:
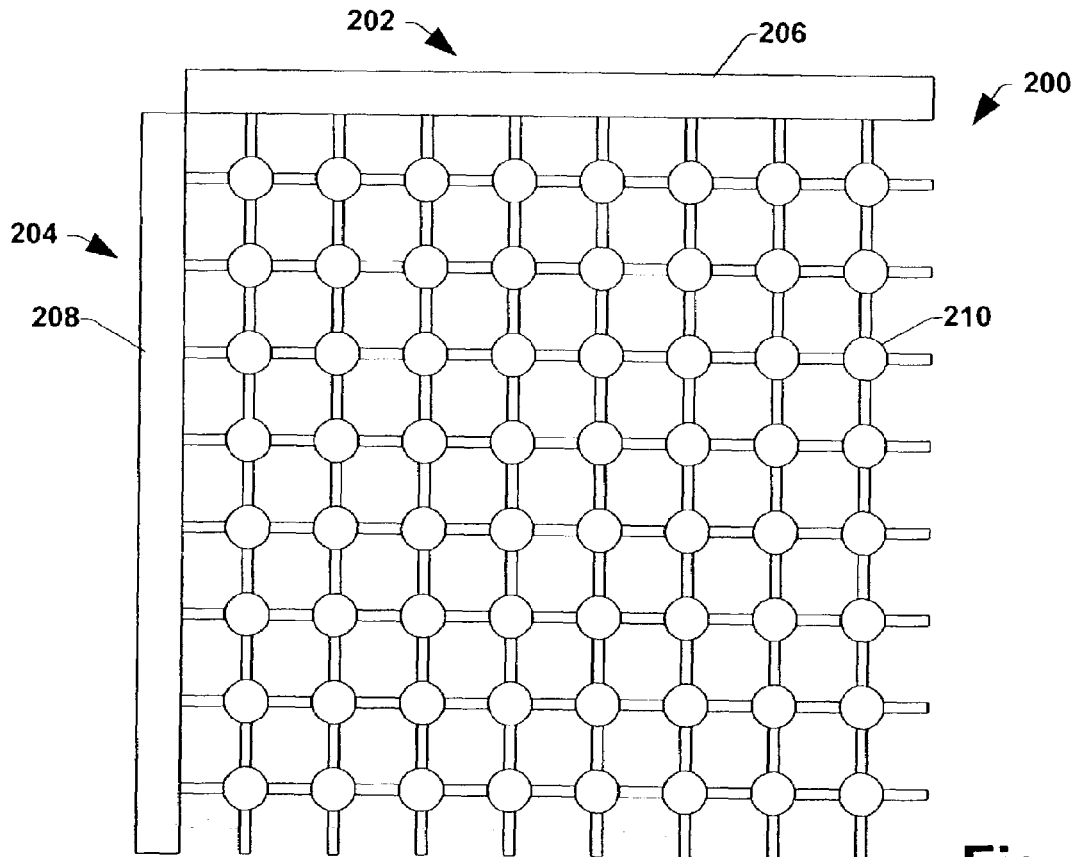
FIG. 2 illustrates an array of memory cells, such as may be composed of cells formed in accordance with an aspect of the present invention.

Turning to FIG. 2, an array 200 of memory cells is illustrated. Such an array is generally formed on a silicon based wafer, and includes a plurality of columns 202, referred to as bitlines, and a plurality of rows 204, referred to as wordlines. The intersection of a bitline and a wordline constitutes the address of a particular memory cell. Data can be stored in the memory cells (e.g., as a 0 or a 1) by choosing and sending signals to appropriate columns and rows in the array (e.g., via a column address strobe (CAS) 206 and a row address strobe (RAS) 208, respectively). For example, the state (e.g., a 0 or a 1) of the memory cell indicated at 210 is a function of the $3^{rd}$ row and $8^{th}$ column of the array 200. In dynamic random access memory (DRAM), for example, memory cells include transistor-capacitor pairs. To write to a memory cell, a charge can be sent to the appropriate column (e.g., via CAS 206) to activate the respective transistors in the columns, and the state that respective capacitors should take on can be sent to the appropriate columns (e.g., via RAS 208). To read the state of the cells, a sense-amplifier can determine the level of charge on the capacitors. If it is more than 50 percent, it can be read as a 1; otherwise it can be read as a 0. It is to be appreciated that while the array 200 illustrated in FIG. 2 includes 64 memory cells (e.g., 8 rows×8 columns), the present invention has application to any number of memory cells and is not to be limited to any particular configuration, arrangement and/or number of memory cells.

FIGS. 3–20 are schematic cross-sectional views depicting a portion of a wafer upon which one or more memory cells can be formed. The Figures illustrate the formation of one or more memory cells on the wafer according to one or more aspects of the present invention. Those skilled in the art will understand and appreciate that various departures from the process shown herein can be utilized to produce one or more memory cells in accordance with aspects of the present invention. Such departures are intended to fall within the scope of the present invention.

Figure 3:
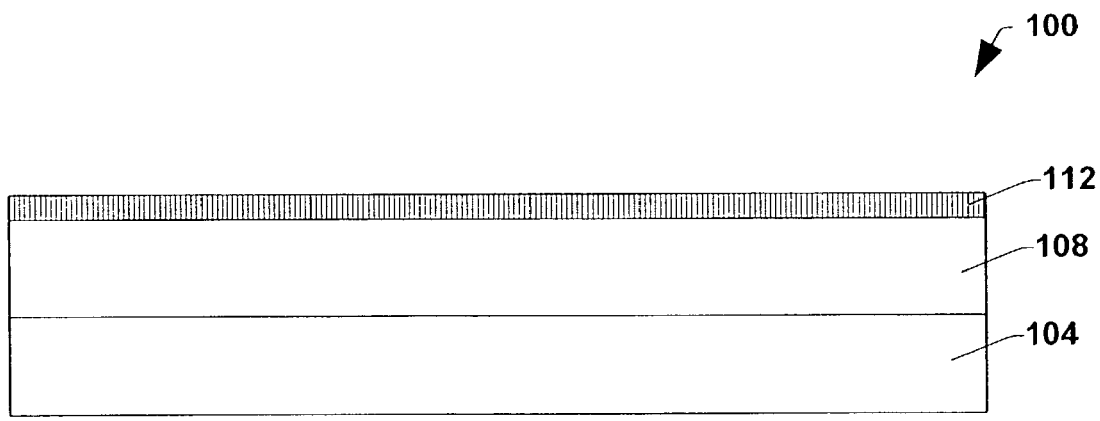
FIG. 3 is a schematic cross sectional illustration of a portion of a wafer having a conductive layer with a conductivity facilitating layer formed thereon in accordance with an aspect of the present invention.

In FIG. 3 the portion of the wafer 100 is depicted having a substrate 104, a first conductive layer 108 with a conductivity facilitating layer 112 formed over the first conductive layer 108. The first conductive layer 108 can serve as a bitline and can include, for example, copper as well as any other suitable conductive material such as aluminum, chromium, germanium, gold, magnesium, manganese, indium, iron, nickel, palladium, platinum, silver, titanium, zinc, alloys thereof, indium-tin oxide, polysilicon, doped amorphous silicon, metal silicides, and the like. Examples of alloys that can be utilized for the conductive material include Hastelloy®, Kovar®, Invar, Monel®, Inconel®, brass, stainless steel, magnesium-silver alloy, and various other alloys. The thickness of the first conductive layer 108 can vary depending on the implementation and intended utilization of the memory device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The conductivity facilitating layer 112 can include, for example, any one or more of copper sulfide ($Cu_{2-x}S_y$, CuS), copper oxide (CuO, $Cu_2O$), manganese oxide ($MnO_2$), titanium dioxide ($TiO_2$), indium oxide ($I_3O_4$), silver sulfide ($Ag_{2-x}S_2$, AgS), silver-copper-sulfide complex ($Ag_yCu_{2-x}S_2$), gold sulfide ($Au_2S$, AuS), cerium sulfate ($Ce(SO_4)_2$), ammonium persulfate ($(NH_4)_2S_2O_8$), iron oxide ($Fe_3O_4$), lithium complexes ($Li_xTiS_2$, $Li_xTiSe_2$, $Li_xNbSe_3$, $Li_xNb_3Se_3$), palladium hydride ($H_xPd$) (where x and y are selected to produce desired properties), and the like, and generally has the ability to donate and accept charges (e.g., holes and/or electrons). Any suitable technique(s) can be utilized in forming the conductivity facilitating layer 112 including, for example, growth, deposition, spin-on and/or sputtering techniques. The conductivity facilitating layer 112 can be applied to any suitable thickness. However, it is to be appreciated that the first conductive layer 108 is generally thicker than the conductivity facilitating layer 112. In one aspect, the thickness of the first conductive layer 108 is from about 50 to about 250 times greater than the thickness of the conductivity facilitating layer 112. In another aspect, the thickness of the first conductive layer 108 is from about 100 to about 500 times greater than the thickness of the conductivity facilitating layer 112. It will be appreciated, however, that other suitable ratios can be employed in accordance with aspects of the present invention.

Figure 4:
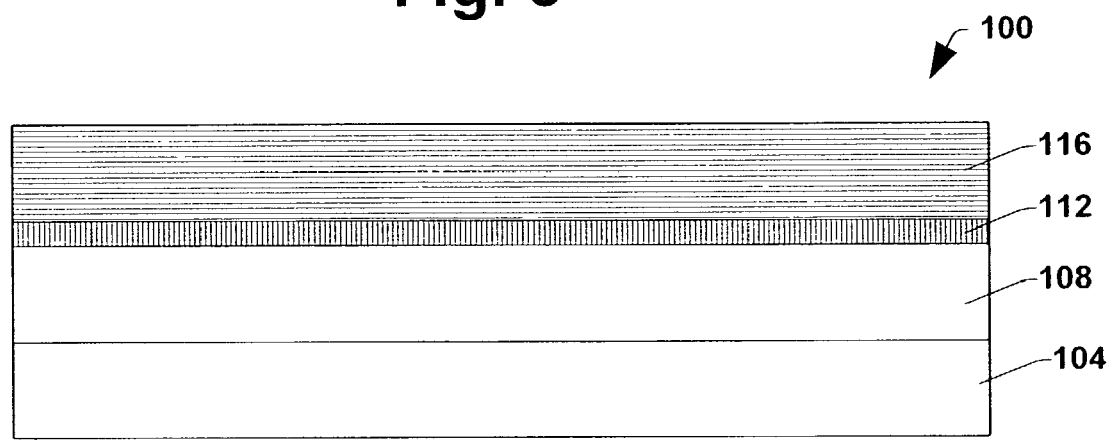
FIG. 4 is a schematic cross sectional illustration of the portion of the wafer depicted in FIG. 3 having an organic polymer layer formed over the conductivity facilitating layer.

FIG. 4 illustrates the portion of the wafer 100 having an organic polymer layer 116 formed over the conductivity facilitating layer 112 and first conductive layer 108. The organic polymer layer 116 can be applied over the underlying layers in any suitable fashion, such as with spin coating techniques, for example. A volume of polymer material can be placed centrally onto the wafer and then distributed uniformly across the surface of the wafer by quickly rotating the wafer. It will be appreciated that the organic polymer layer 116 can include, for example, any one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polypyrroles; polystiroles, polydiphenylacetylene (DPA), Si, about 1.5% of Cu (in I and II states), and about 28% of O and the like. Additionally, the properties of the polymer can be modified by doping with a suitable dopant (e.g., salt). The organic polymer layer 116 has a suitable thickness that depends upon the chosen implementations and/or intended utilization of the memory device being fabricated, and an example of one such suitable thickness includes a range between about 300 Å to 5000 Å.

Figure 5:
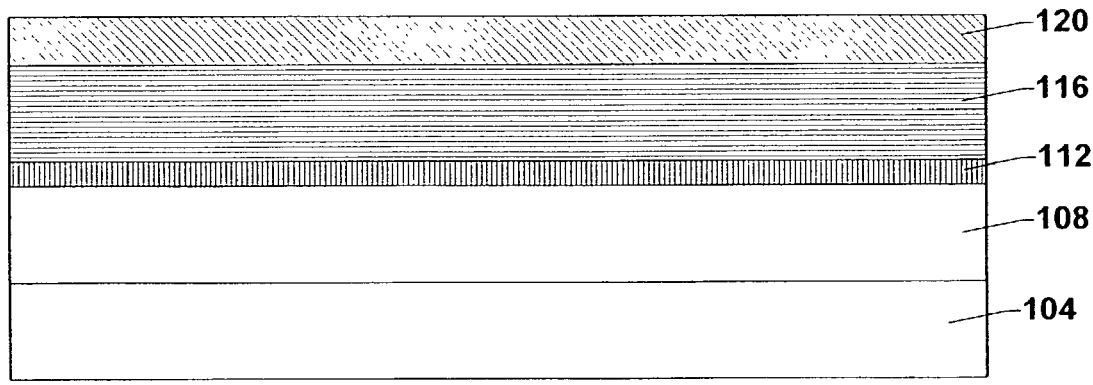
FIG. 5 is a schematic cross sectional illustration of the portion of the wafer depicted in FIG. 4 having an electrode layer formed over the organic polymer layer.
Figure 5A:
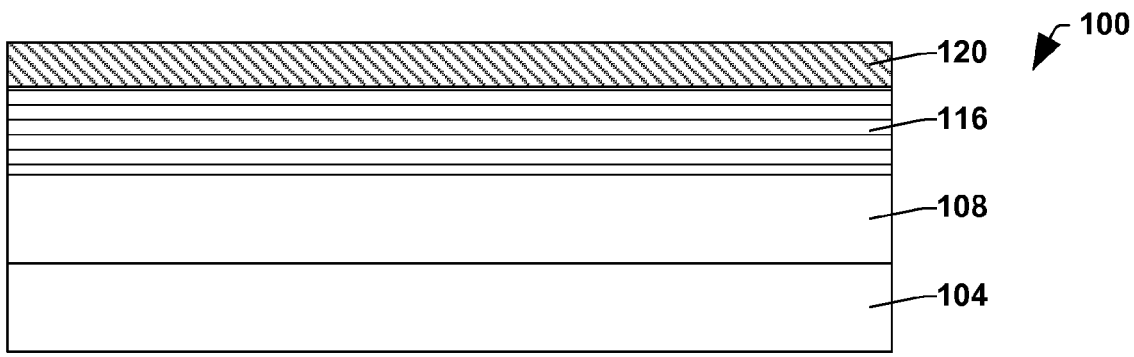

In FIG. 5 and FIG. 5A the portion of the wafer 100 is depicted having an electrode layer 120 formed over the organic polymer layer 116, the optional conductivity facilitating layer 112, the first conductive layer 108 and the substrate 104. FIG. 5A specifically depicts the portion of the wafer 100 the optional conductivity facilitating layer 112 is absent, having an electrode layer 120 formed over the organic polymer layer 116, the first conductive layer 108 and the substrate 104. The electrode layer 120 can include, for example, any one or more of amorphous carbon, tantalum, tantalum nitride (TaN), titanium, titanium nitride (TiN), and can be formed via any number of suitable techniques. One technique that can be utilized to form the electrode layer 120 is a spin-coating technique which involves depositing a mixture of material that makes up the electrode layer 120 and then quickly rotating the wafer 100 to evenly distribute the material across the wafer 100. Alternatively, or in addition, sputtering, growth and/or deposition technique(s) can be implemented to form the electrode layer 120 including, for example, physical vapor deposition (PVD), chemical vapor deposition (CVD), low pressure chemical vapor deposition (LPCVD), plasma enhanced chemical vapor deposition (PECVD), high density chemical vapor deposition (HDCVD), rapid thermal chemical vapor deposition (RTCVD), metal organic chemical vapor deposition (MOCVD) and pulsed laser deposition (PLD). It is to be appreciated that the electrode layer 120 can have any suitable thickness depending upon the chosen implementations and/or intended utilization of the memory device being fabricated. One such suitable thickness for the electrode layer 120 includes a range between about 100 Å to 1500 Å, for example. It is to be further appreciated that the organic polymer layer 116 is generally thicker than the electrode layer 120. In one aspect, the thickness of the organic polymer layer 116 is from about 10 to about 500 times greater than the thickness of the electrode layer 120. It will be appreciated, however, that other suitable ratios can be employed in accordance with aspects of the present invention.

Figure 6:
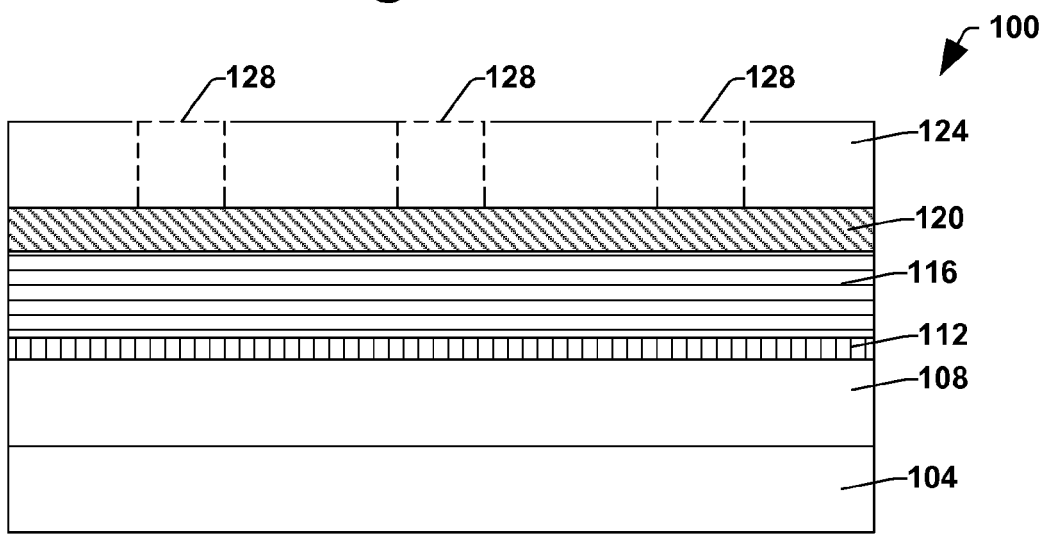
FIG. 6 is a schematic cross sectional illustration of the portion of the wafer depicted in FIG. 5 having a patterned photoresist layer formed over the electrode layer.

In FIG. 6, a portion of the wafer 100 is illustrated having a photoresist layer 124 formed over the electrode 120, the organic polymer 116, conductivity facilitating 112, first conductive 108 layers and the substrate 104. The photoresist layer 124 can, for example, be grown, deposited, spun-on and/or sputtered onto the underlying layers to a thickness suitable for functioning as a mask for etching underlying layer(s) and for forming pattern(s) or opening(s) in the developed photoresist layer 124. By way of example, one deep UV chemically amplified photoresist is a partially t-butoxycarbonyloxy substituted poly-p-hydroxystyrene.

Photoresists are commercially available from a number of sources, including Shipley Company, Kodak, Hoechst Celanese Corporation, Brewer and IBM. The photoresist 112 can be either a positive or negative photoresist, and as such either the exposed or unexposed portions of the photoresist can subsequently be removed or developed; depending upon the type of resist utilized.

In the example illustrated, the photoresist layer 124 has been exposed to facilitate forming one or more patterns 128 in the photoresist 124. The patterned photoresist 124 can be formed using electromagnetic radiation having a relatively short wavelength (e.g., less than 200 nm), for example. It will be appreciated that the photoresist layer 124 can be selectively exposed to the radiation; that is, selected portions of the photoresist layer 124 can be exposed to radiation to form the patterns 128 therein.

Figure 7:
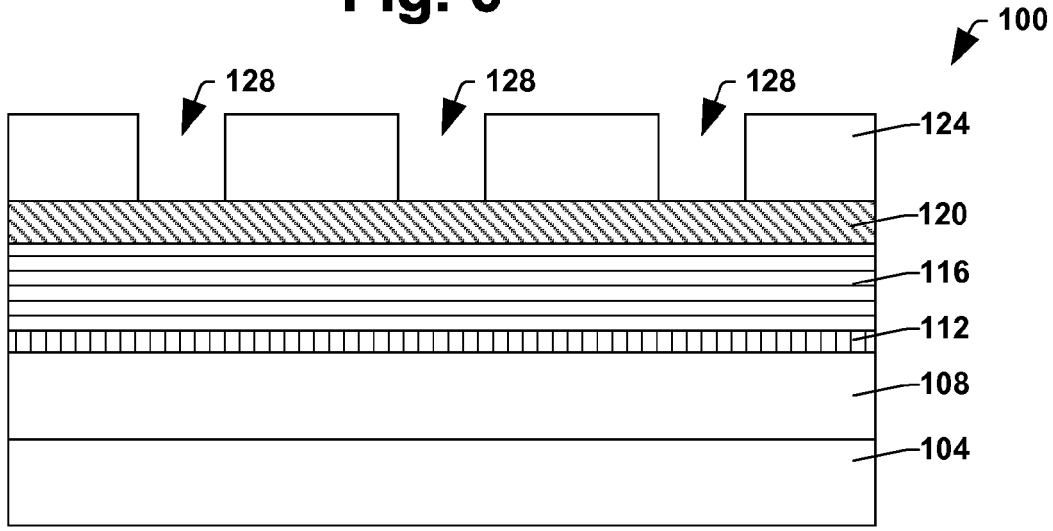
FIG. 7 is a schematic cross sectional illustration of the portion of the wafer depicted in FIG. 6 with apertures formed in the patterned photoresist layer.

In FIG. 7 the portion of the wafer 100 is illustrated with the selectively exposed photoresist layer 124 developed (e.g., via interaction with a suitable developer that removes either the exposed or unexposed portions of the photoresist layer 124). Portions of the photoresist layer 124 are removed to form opening(s) or aperture(s) 128 therein. The identity of the developer can depend upon the specific chemical constitution of the photoresist layer 124, among other things. For example, an aqueous alkaline solution may be employed to remove portions of the photoresist layer 124. Alternatively, one or more of dilute aqueous acid solutions, hydroxide solutions, water, and organic solvent solutions may be employed to remove selectively exposed portions of the photoresist layer 124.

Figure 8:
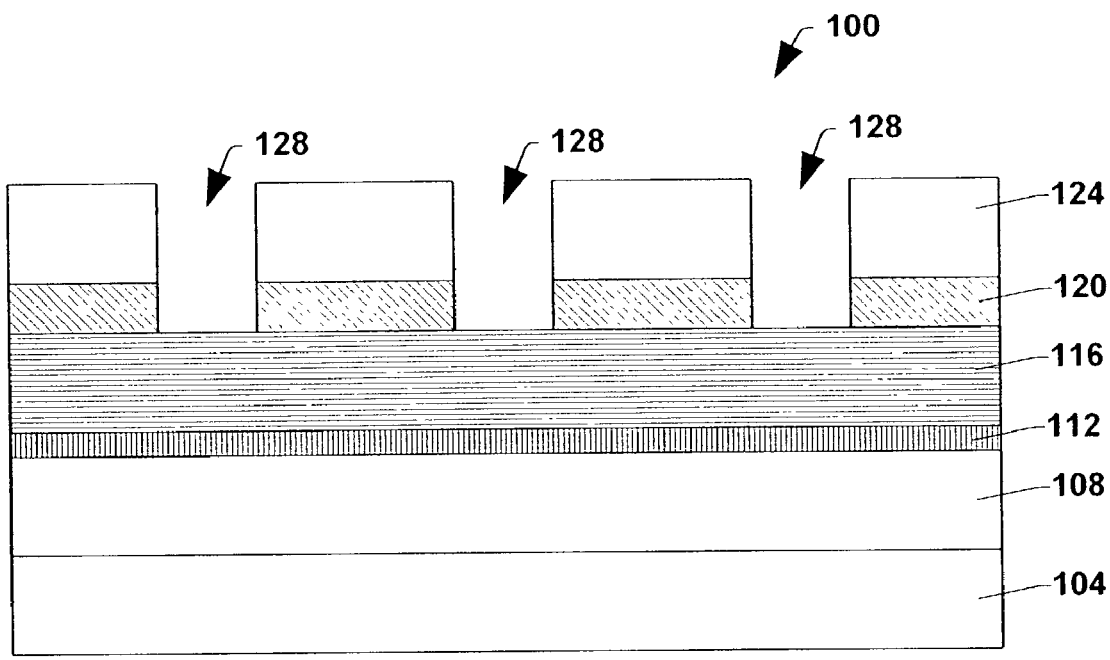
FIG. 8 is a schematic cross sectional illustration of the portion of the wafer depicted in FIG. 7 having the apertures etched into the electrode layer.

FIG. 8 illustrates the portion of the wafer 100 wherein the electrode layer 120 is etched to continue forming the one or more apertures 128 in the stack with the photoresist layer 124 continuing to serve as a mask for the etching. Etching the electrode layer 120 in this manner facilitates establishment of top electrodes for resulting memory cells.

Figure 9:
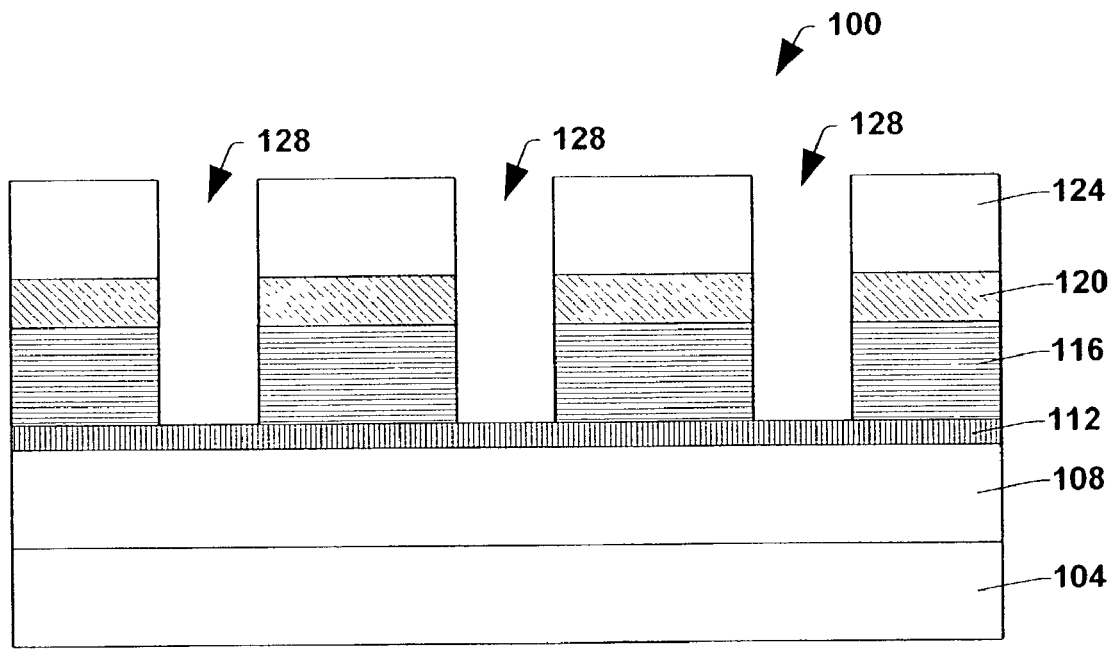
FIG. 9 is a schematic cross sectional illustration of the portion of the wafer depicted in FIG. 8 having the apertures etched into the organic polymer layer.

In FIG. 9, the apertures 128 are etched into the organic polymer layer 116. The organic polymer layer 116 can, for example, be dry etched with $O_2/N_2$+CO and/or $O_2/N_2$ etchant compositions.

Figure 10:
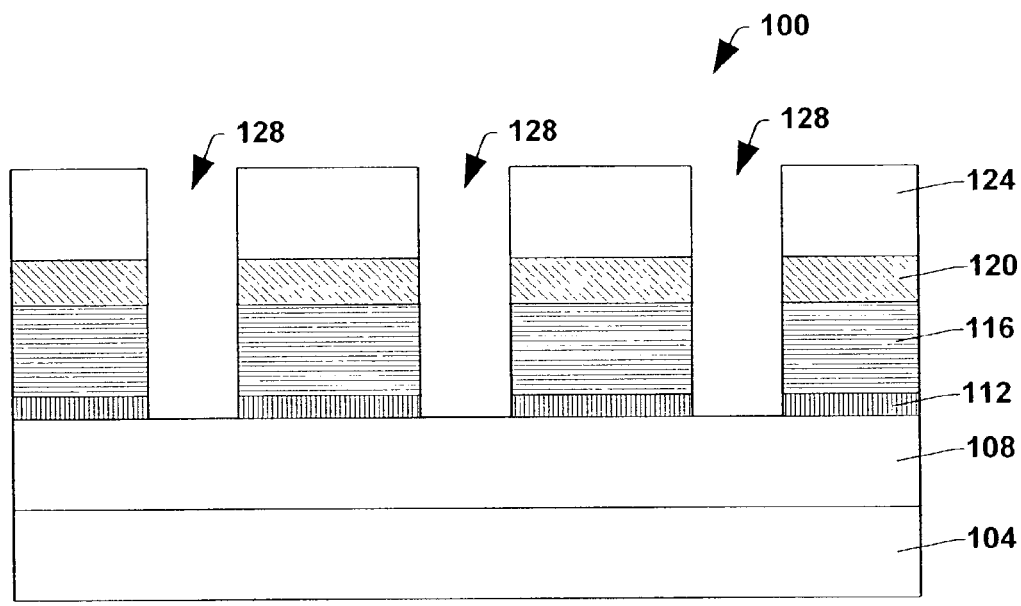
FIG. 10 is a schematic cross sectional illustration of the portion of the wafer depicted in FIG. 9 having the apertures etched into the conductivity facilitating layer.
Figure 11:
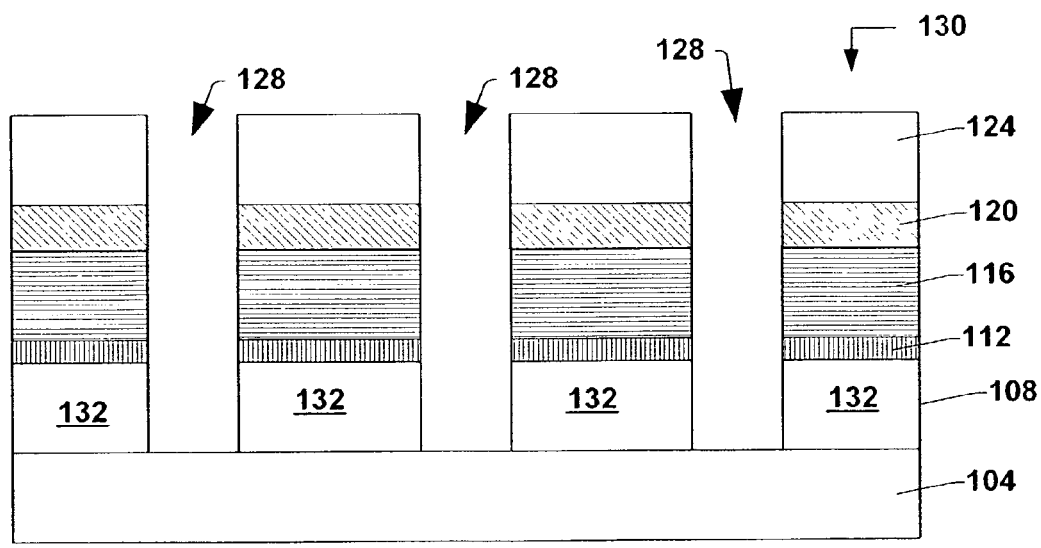
FIG. 11 is a schematic cross sectional illustration of the portion of the wafer depicted in FIG. 10 having the apertures etched into the first conductivity layer.

FIG. 10 illustrates the portion of the wafer 100 wherein the conductivity facilitating layer 112 is etched to continue forming the one or more apertures 128 with the photoresist layer 124 continuing to serve as a mask for the etching. In FIG. 11, the apertures 128 are etched into the first conductive layer 104, thus forming bitline 132.

Figure 12:
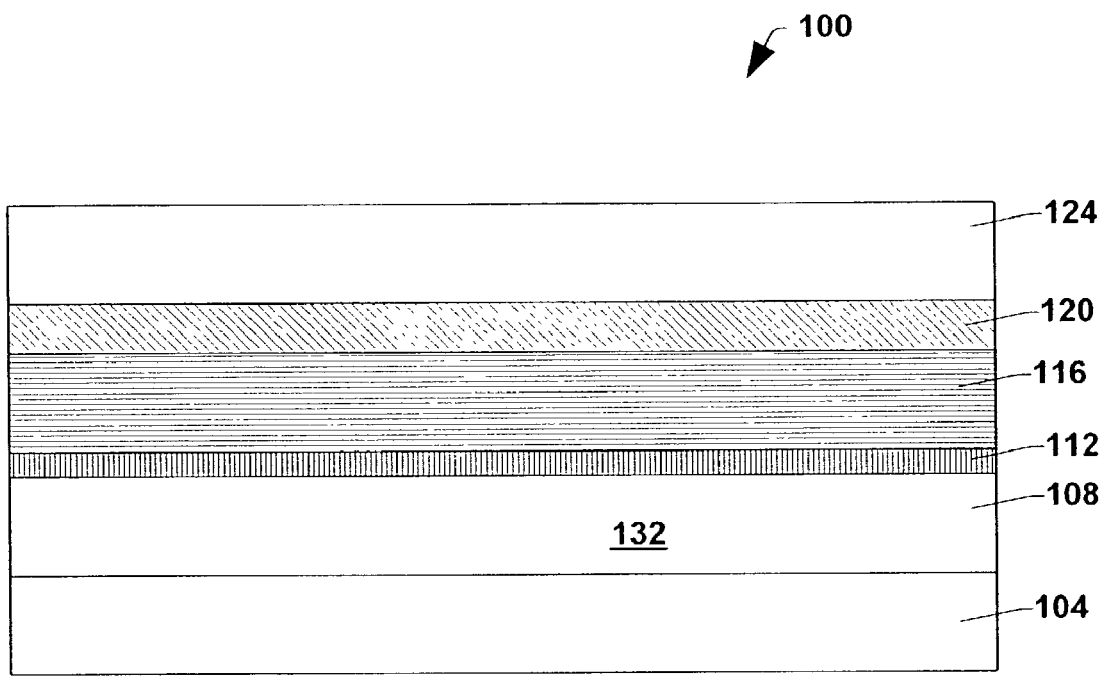
FIG. 12 is another schematic cross sectional illustration of the portion of the wafer depicted in FIG. 11.

Referring briefly to FIG. 12, a second cross-sectional view of the wafer 100 in the processing stage of FIG. 10 along line 130—130 is illustrated. The bitline 132 is a continuous row in FIG. 12.

Figure 13:
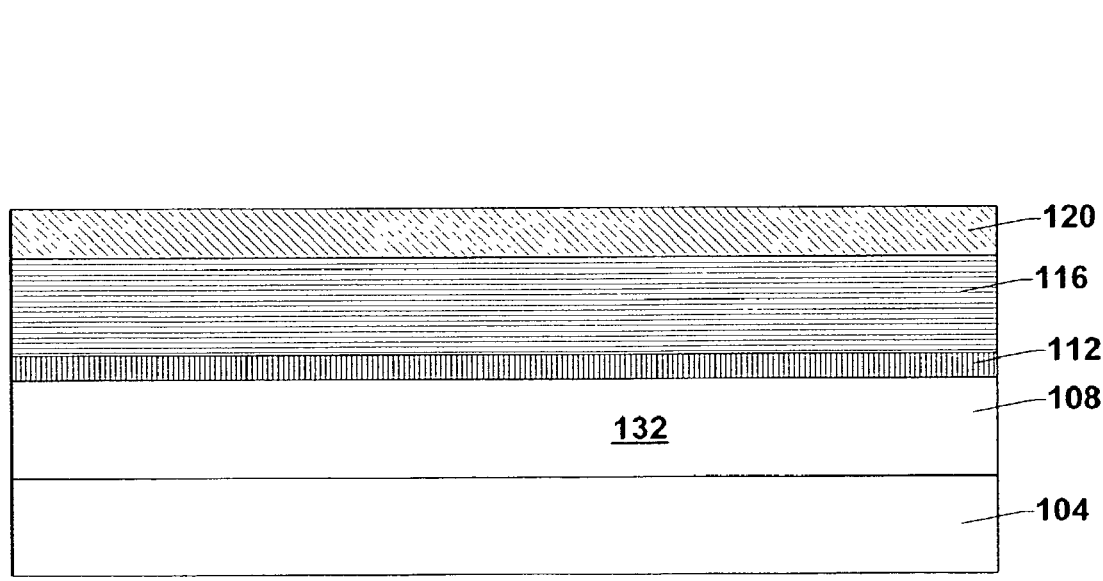
FIG. 13 is a schematic cross sectional illustration of the portion of the wafer depicted in FIG. 12 with the remaining portions of the photoresist layer removed.

In FIG. 13, the remaining portions of the photoresist layer 124 are removed. For example, the remaining portions of the photoresist layer 124 can be ashed with an $O_2$ plasma or chemical stripper, for example, to remove the photoresist layer 124.

Figure 14:
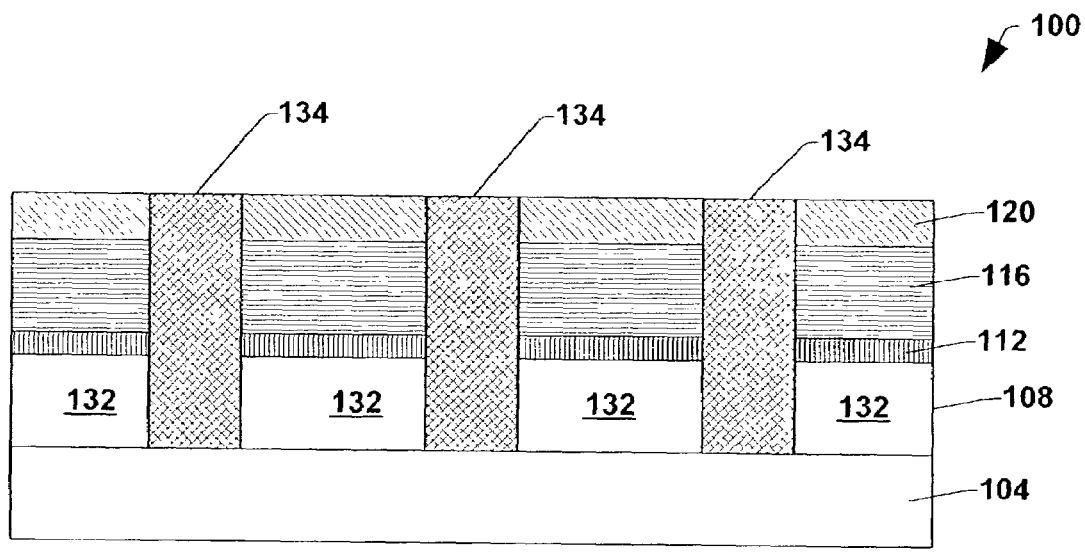
FIG. 14 is a schematic cross sectional illustration of the portion of the wafer depicted in FIG. 12 with the remaining portions of the photoresist layer removed with a dielectric material applied over the stack and filling in the apertures.

Returning to the orientation of the wafer 100 as shown in FIG. 11, FIG. 14 illustrates a dielectric or insulating material 134 deposited around the electrode layer 120, organic polymer 116, conductivity facilitating 112, first conductive 108 layers and over the substrate 104. The dielectric material 134 fills in the apertures 128 formed into the electrode 120, organic polymer 116, conductivity facilitating 112 and first conductive 108 layers, and is formed to a height sufficient to be commensurate with an overlying wordline (not shown). The dielectric material 134 can, for example, be formed to a height of about less than or equal to 2 μm. The dielectric material 134 can include, for example, silicon oxide (SiO), silicon dioxide ($SiO_2$), silicon nitride ($Si_3N_4$), (SiN), silicon oxynitride ($SiO_xN_y$), fluorinated silicon oxide ($SiO_xF_y$), polysilicon, amorphous silicon, tetraethyorthosilicate (TEOS), phosphosilicate glass (PSG), borophosphosilicate glass (BPSG), any suitable spin-on glass, polyimide(s) or any other suitable dielectric material.

It will be appreciated that the dielectric material 134 may be applied in multiple stages. For example, the dielectric material 134 can initially be deposited at a low deposition rate with a conformal dielectric to fill in the apertures. In one example, additional dielectric material 134 can then be applied according to a faster deposition process such as, for example, spin coating, sputtering, thermal oxidation and nitridation of single crystal silicon and polysilicon, the formation of silicides by direct reaction of a deposited metal, chemical vapor deposition (CVD), physical vapor deposition (PVD), low pressure CVD (LPCVD), plasma enhanced CVD (PECVD), high density chemical plasma vapor deposition (HDCPVD), rapid thermal CVD (RTCVD), metal organic chemical vapor deposition (MOCVD) and/or pulsed laser deposition (PLD).

Figure 15:
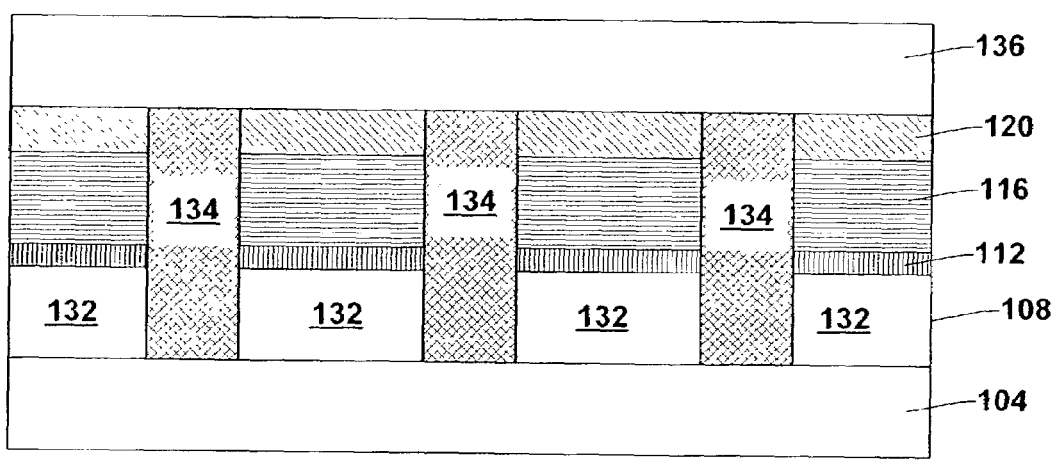
FIG. 15 is a schematic cross sectional illustration of the portion of the wafer depicted in FIG. 14 having a second conductive layer formed over the dielectric material and the electrode layer.

Referring to FIG. 15, deposition of a second conductive layer 136 formed over the electrode layer 120, organic polymer 116, conductivity facilitating 112, first conductive 108 layers and the substrate 104. In particular the electrode layer 120 is connected to the second conductive layer 136. In one example, the second conductive layer 136 includes deposited aluminum.

Figure 16:
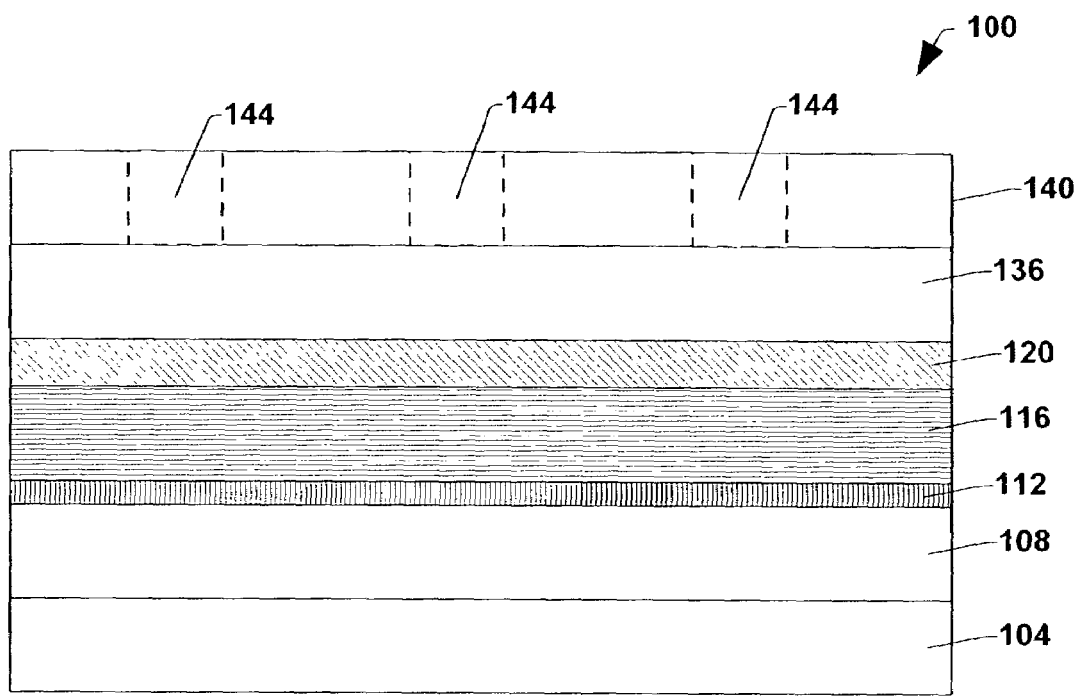
FIG. 16 is another schematic cross sectional illustration of the portion of the wafer depicted in FIG. 15 having a patterned photoresist layer formed over the second conductive layer.
Figure 17:
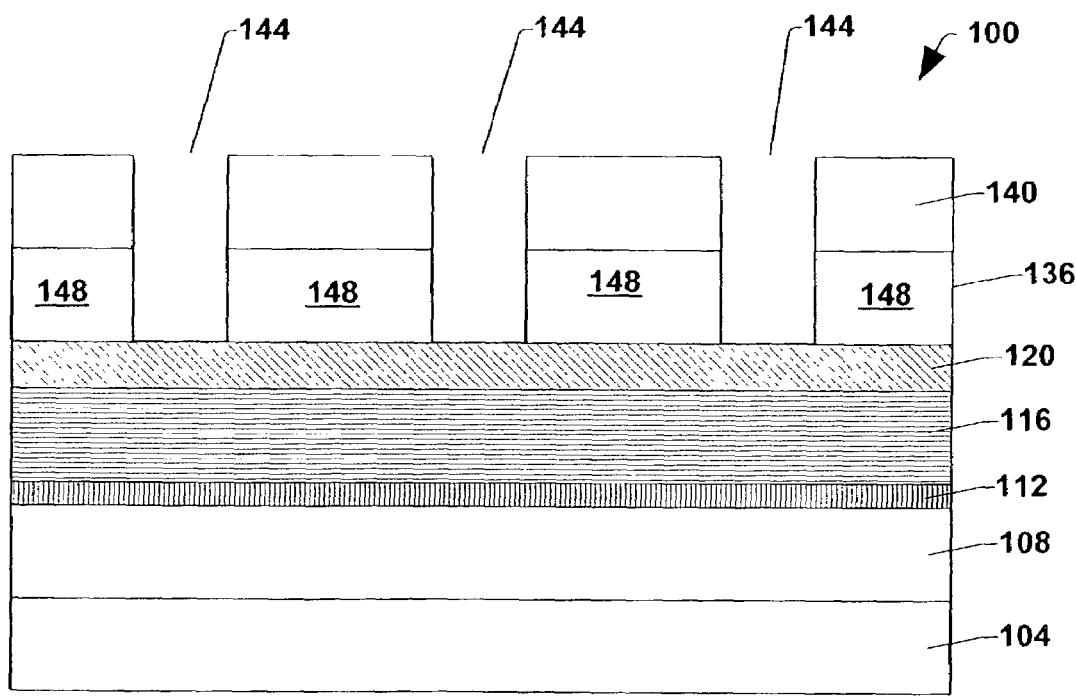
FIG. 17 is a schematic cross sectional illustration of the portion of the wafer depicted in FIG. 16 with apertures formed in the second conductive layer forming wordlines.
Figure 18:
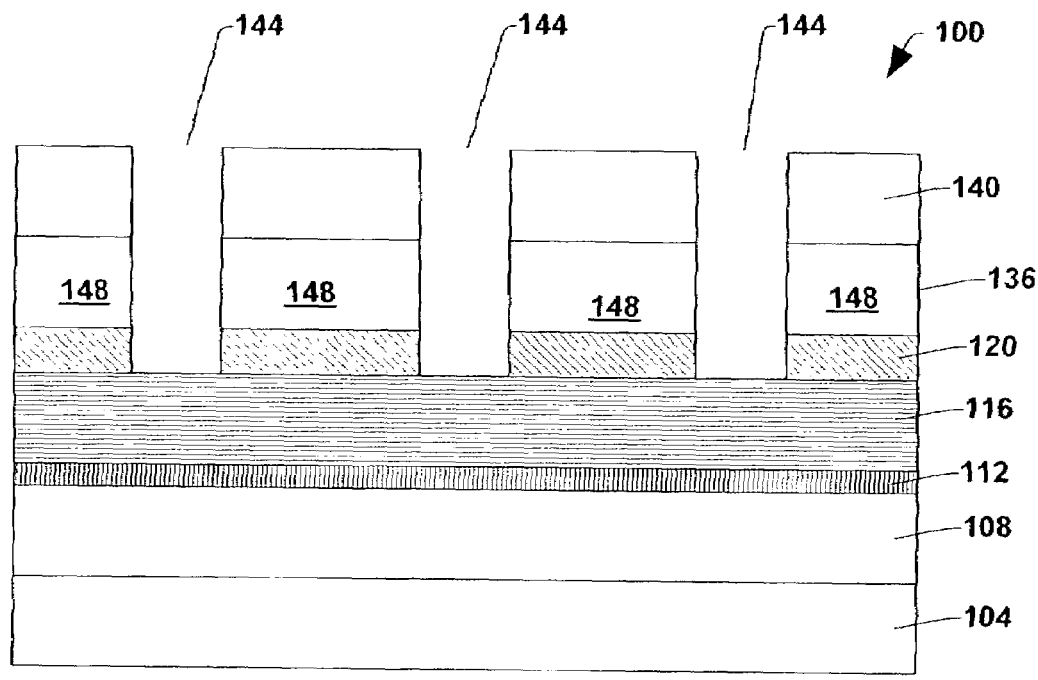
FIG. 18 is a schematic cross sectional illustration of the portion of the wafer depicted in FIG. 17 with apertures formed in the electrode layer.
Figure 19:
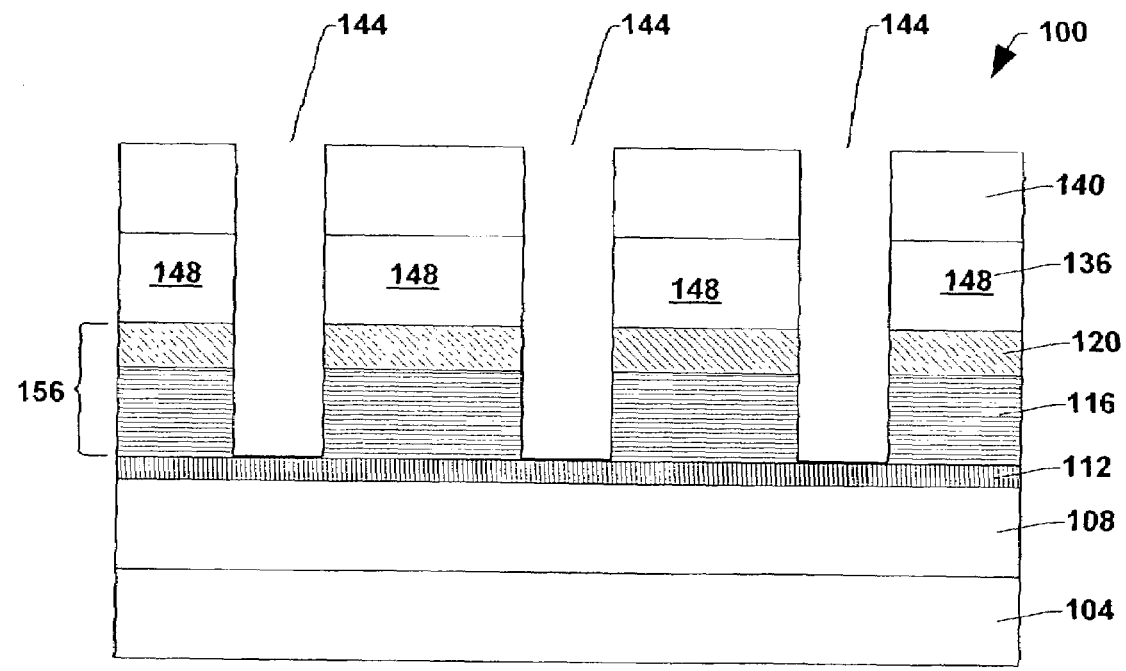
FIG. 19 is a schematic cross sectional illustration of the portion of the wafer depicted in FIG. 18 with apertures formed in the organic polymer layer.
Figure 20:
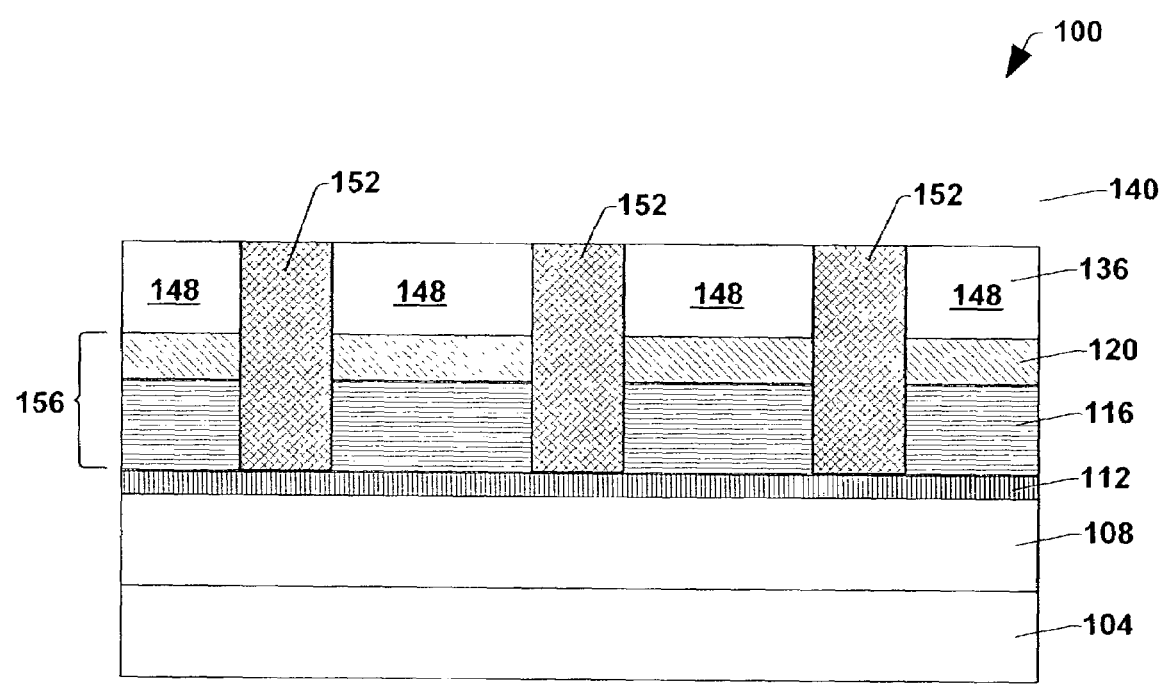
FIG. 20 is a schematic cross sectional illustration of the portion of the wafer depicted in FIG. 19 the remaining portions of the photoresist layer removed with a dielectric material applied over the stack and filling in the apertures.

FIG. 16 illustrates patterning of the second conductive layer 136 to form wordlines (not shown). The patterning can be performed using a photoresist layer 140 and selective etching as discussed above. Portions of the photoresist layer 140 are removed to form opening(s) or aperture(s) 144 therein. The aperture(s) 144 form wordlines 148. In addition to forming the wordlines 148 by selective etching of the second conductive layer 136 (FIG. 17), the selective etching can selectively remove portions of the electrode layer 120 (FIG. 18), and, the organic polymer layer 116 (FIG. 19), thus further isolating memory cells 156. The opening(s) or aperture(s) 144 can then be filled with a dielectric material 152 as discussed above (FIG. 20). Accordingly, the memory cells 156 are self-aligned with the bitlines 132 formed in the first conductive layer 108 and the wordlines 148 formed in the second conductive layer 136.

The memory cells 156 are useful in any device requiring memory. For example, the memory devices can be utilized in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, palm pilots, pagers, notebook computers, remote controls, recorders (video and audio), radios, small televisions and web viewers, cameras, and the like.

Figure 22:
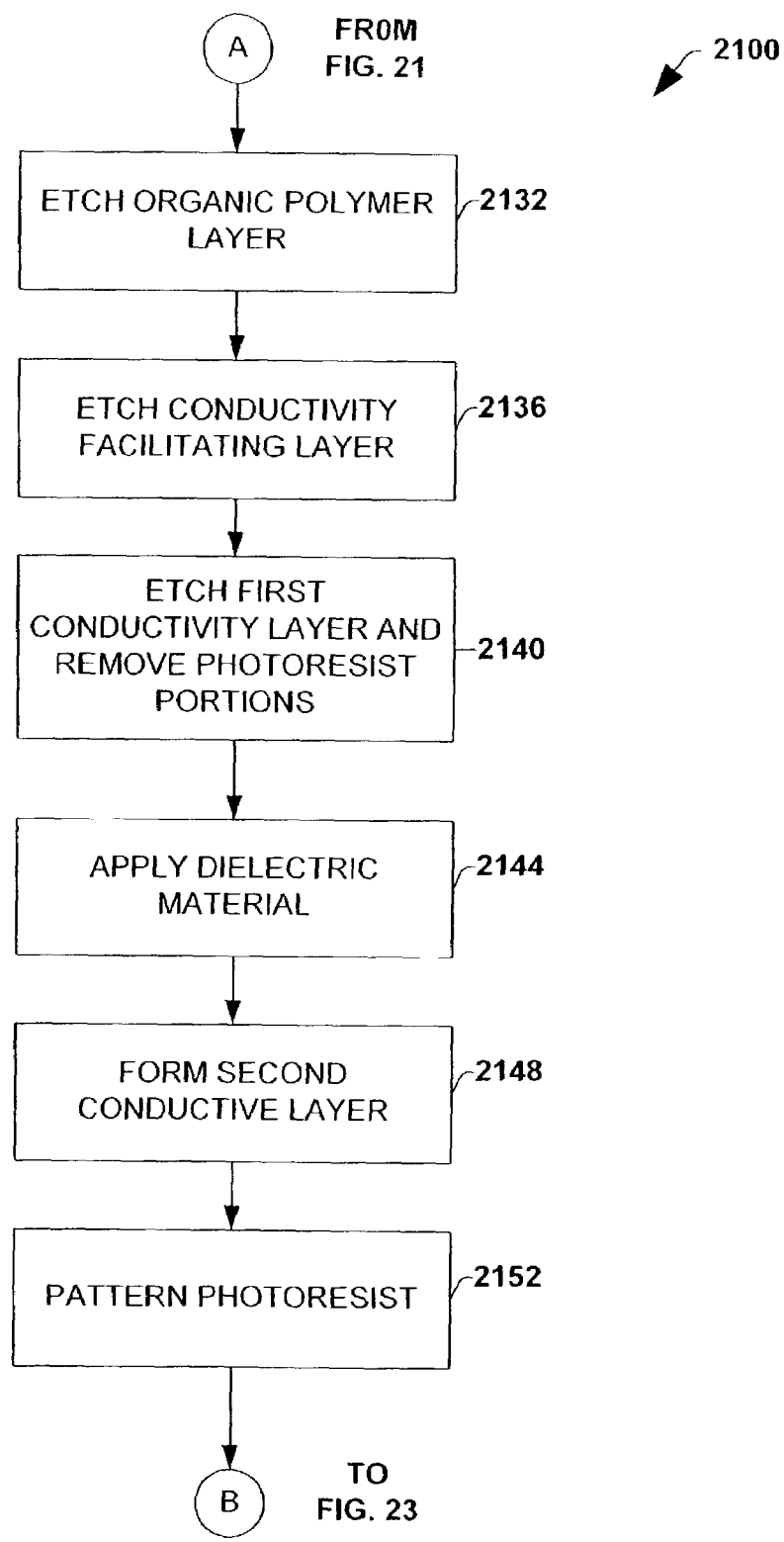
FIG. 22 is a flow chart further illustrating the method of FIG. 21.
Figure 23:
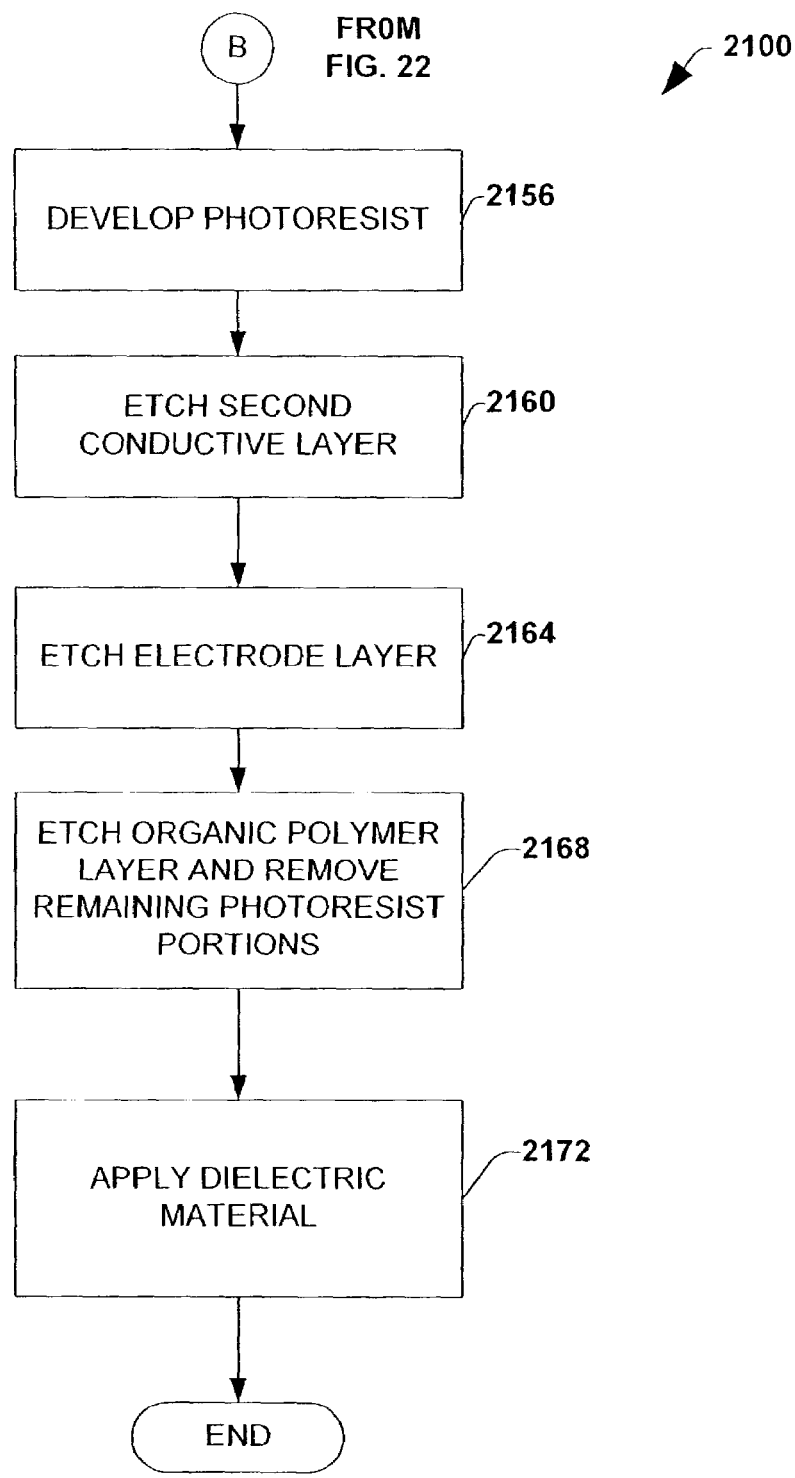
FIG. 23 is a flow chart further illustrating the method of FIGS. 21 and 22.
Figure 24:
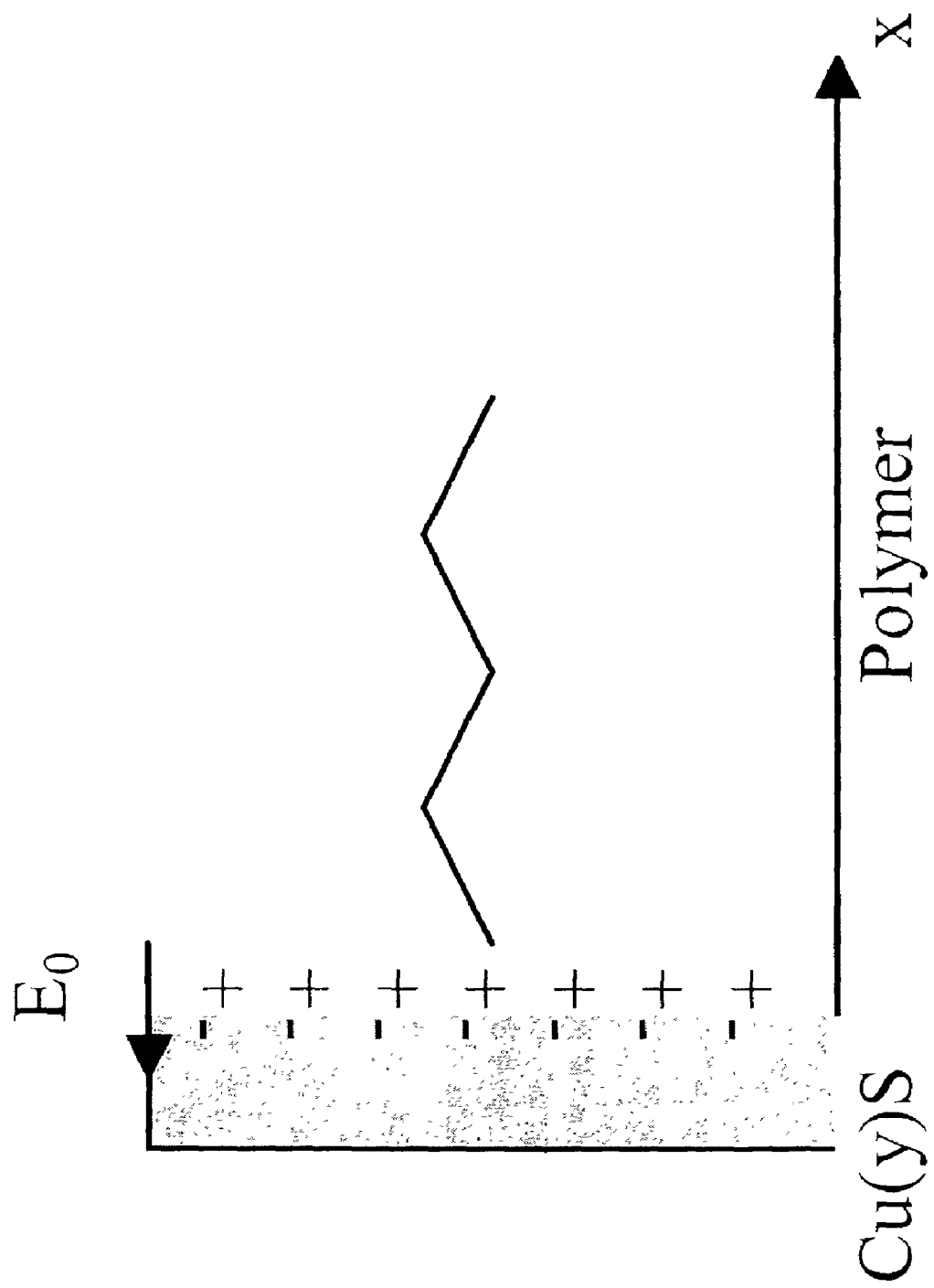
FIG. 24 is a graph depicting the effect of an intrinsic electric field on an interface between a conductivity facilitating layer and a polymer layer in accordance with one or more aspects of the present invention.

In view of what has been shown and described above, a methodology, which may be implemented in accordance with one or more aspects of the present invention, will be better appreciated with reference to the flow diagrams of FIGS. 22, 23 and 24. While, for purposes of simplicity of explanation, the methodology is shown and described as a series of function blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with one or more aspects of the present invention. It is to be appreciated that the various blocks may be implemented via software, hardware a combination thereof or any other suitable means (e.g., device, system, process, component) for carrying out the functionality associated with the blocks. It is also to be appreciated that the blocks are merely to illustrate certain aspects of the present invention in a simplified form and that these aspects may be illustrated via a lesser and/or greater number of blocks.

Figure 21:
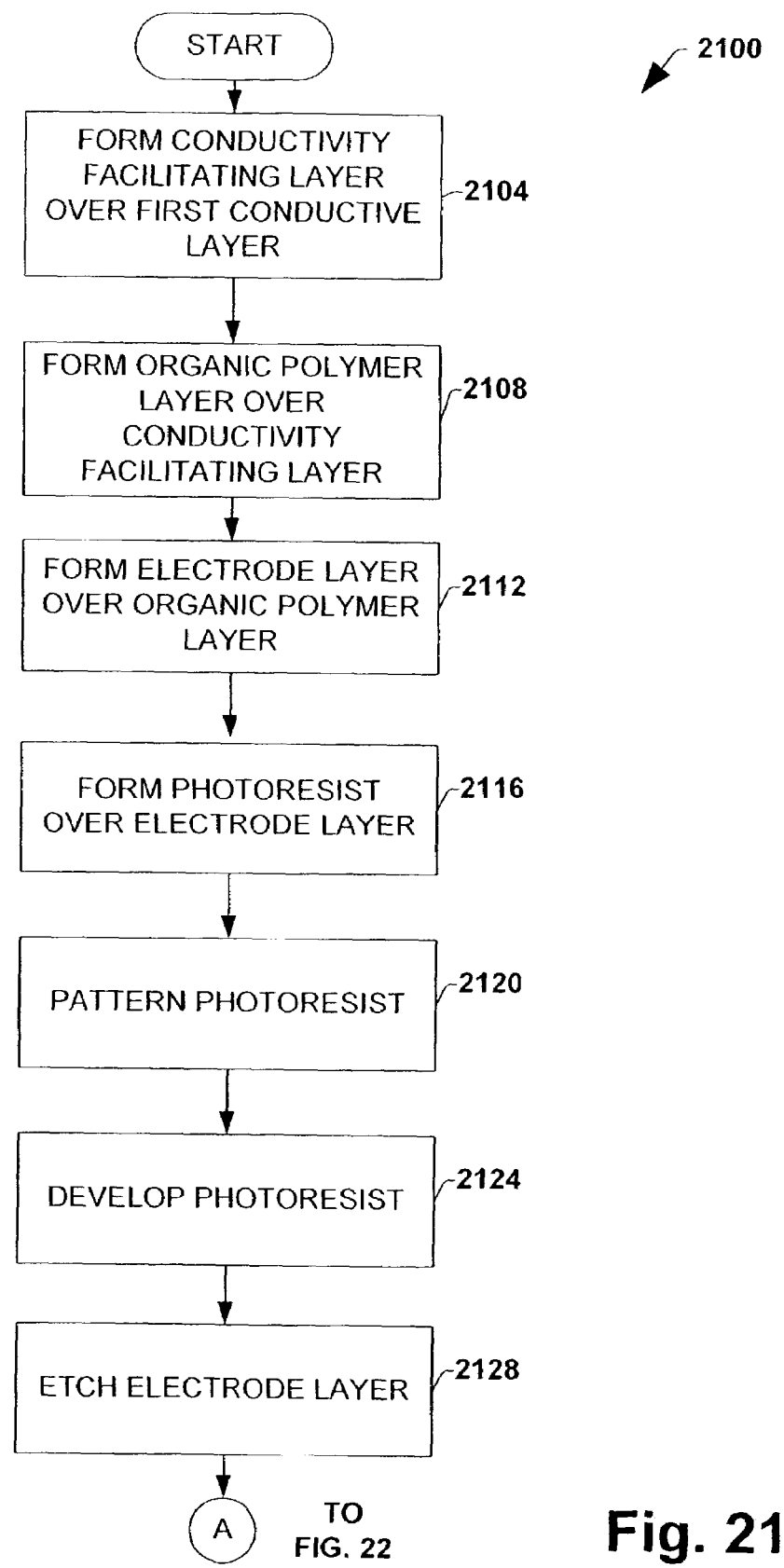
FIG. 21 is a flow chart illustrating a method for forming a memory cell in accordance with an aspect of the present invention.

Turning to FIGS. 21, 22 and 23, a methodology 2100 for forming a memory cell according to one or more aspects of the present invention. At 2104, a conductivity facilitating layer is formed over a first conductive layer (e.g., the first conductive layer can serve as a bitline). Any suitable technique(s) can be utilized to form the conductivity facilitating layer including, for example, growth, deposition, spin-on and/or sputtering techniques. The conductivity facilitating layer can be applied to any suitable thickness depending on the implementation and intended utilization of the memory device being constructed. It will be appreciated, however, that the conductive layer is generally thicker than the conductivity facilitating layer. According to one aspect of the present invention, the thickness of the conductive layer can be from about 50 to about 250 times greater than the thickness of the conductivity facilitating layer. In another aspect of the present invention, the thickness of the conductive layer can be from about 100 to about 500 times greater than the thickness of the conductivity facilitating layer. It will be appreciated, however, that other suitable ratios can be employed in accordance with aspects of the present invention.

The conductivity facilitating layer can include, for example, any one or more of copper sulfide ($Cu_{2-x}S_y$, CuS), copper oxide (CuO, $Cu_2O$), manganese oxide ($MnO_2$), titanium dioxide ($TiO_2$), indium oxide ($I_3O_4$), silver sulfide ($Ag_{2-x}S_2$, AgS), silver-copper-sulfide complex ($Ag_yCu_{2-x}S_2$), gold sulfide ($Au_2S$, AuS), cerium sulfate ($Ce(SO_4)_2$), ammonium persulfate (($NH_4)_2S_2O_8$), iron oxide ($Fe_3O_4$), lithium complexes ($Li_xTiS_2$, $Li_xTiSe_2$, $Li_xNbSe_3$, $Li_xNb_3Se_3$), Palladium hydride ($H_xPd$) (where x and y are selected to produce desired properties), and generally has the ability to donate and accept charges (e.g., holes and/or electrons). The conductive layer can include, for example, copper as well as any other suitable conductive material such as aluminum, chromium, germanium, gold, magnesium, manganese, indium, iron, nickel, palladium, platinum, silver, titanium, zinc, alloys thereof, indium-tin oxide, polysilicon, doped amorphous silicon, metal silicides, and the like. Examples of alloys that can be utilized for the conductive material include Hastelloy®, Kovar®, Invar, Monel®, Inconel®, brass, stainless steel, magnesium-silver alloy, and various other alloys. Some exemplary thickness ranges for the conductive layer include about 0.01 μm or more and about 10 μm or less, about 0.05 μm or more and about 5 μm or less, and/or about 0.1 μm or more and about 1 μm or less.

At 2108, an organic polymer layer is formed over the conductivity facilitating and first conductive layers. The organic polymer layer can be applied over the underlying layers in any suitable fashion, such as with spin coating techniques, for example. A volume of organic polymer material can be placed centrally onto the wafer and then distributed uniformly across the surface of the wafer by quickly rotating the wafer. It will be appreciate that the organic polymer layer can include, for example, any one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polypyrroles; polydiphenylacetylene (DPA), Si, about 1.5% of Cu (in I and II states), and about 28% of O and the like. Additionally, the properties of the polymer can be modified by doping with a suitable dopant (e.g., salt). The organic polymer layer can have any suitable thickness as depends upon the chosen implementations and/or intended utilization of the memory device being fabricated, and an example of one such suitable thickness includes a range between about 300 Å to 5000 Å.

At 2112, an electrode layer is formed over the organic polymer, conductivity facilitating and first conductive layers. The electrode layer can include, for example, any one or more of amorphous carbon, tantalum, tantalum nitride (TaN), titanium, titanium nitride (TiN), and can be formed via any number of suitable techniques. One technique that can be utilized to form the electrode layer is a spin-coating technique which involves depositing a mixture of material that makes up the electrode layer and then quickly rotating the wafer to evenly distribute the material across the wafer. Alternatively, or in addition, sputtering, growth and/or deposition techniques can be implemented to form the electrode layer including, for example, physical vapor deposition (PVD), chemical vapor deposition (CVD), low pressure chemical vapor deposition (LPCVD), plasma enhanced chemical vapor deposition (PECVD), high density chemical vapor deposition (HDCVD), rapid thermal chemical vapor deposition (RTCVD), metal organic chemical vapor deposition (MOCVD) and pulsed laser deposition (PLD). It is to be appreciated that the electrode layer can have any suitable thickness depending upon the chosen implementations and/or intended utilization of the memory device being fabricated. One such suitable thickness for the electrode layer includes a range between about 100 Å to 1500 Å, for example. It is to be further appreciated that the polymer layer is generally thicker than the electrode layer. According to one aspect of the present invention, the thickness of the polymer layer is from about 10 to about 500 times greater than the thickness of the electrode layer. In another aspect of the present invention, the thickness of the polymer layer is from about 25 to about 250 times greater than the thickness of the electrode layer. It will be appreciated, however, that other suitable ratios can be employed in accordance with aspects of the present invention.

Then, at 2116, a photoresist layer is then formed over the electrode, organic polymer, conductivity facilitating and first conductive layers. The photoresist layer can, for example, be grown, deposited, spun-on and/or sputtered onto the underlying layers to any thickness suitable for functioning as a mask for etching underlying layer (s) and for forming patterns or openings in the developed photoresist layer. By way of example, one deep UV chemically amplified photoresist is a partially t-butoxycarbonyloxy substituted poly-p-hydroxystyrene. Photoresists are commercially available from a number of sources, including Shipley Company, Kodak, Hoechst Celanese Corporation, Brewer and IBM. The photoresist can be either a positive or negative photoresist, and as such either the exposed or unexposed portions of the photoresist can subsequently be removed or developed, depending upon the type of resist utilized.

At 2120, the photoresist is exposed to facilitate forming one or more patterns therein. The photoresist can be patterned using-electromagnetic radiation having a relatively small wavelength (e.g., less than 200 nm), for example. It is to be appreciated that the photoresist layer can be selectively exposed to the radiation; that is, selected portions of the photoresist layer can be exposed to radiation to form the patterns therein.

After the photoresist is exposed, at 2124, the selectively exposed photoresist layer is developed, such as by interaction with a suitable developer that removes either the exposed or unexposed portions of the photoresist layer. Portions of the photoresist layer are removed to form openings or apertures therein. The identity of the developer can depend upon, among other things, the specific chemical constitution of the photoresist layer. For example, an aqueous alkaline solution may be employed to remove portions of the photoresist layer. Alternatively, one or more of dilute aqueous acid solutions, hydroxide solutions, water, and organic solvent solutions may be employed to remove selected portions of the photoresist layer.

At 2128, the electrode layer is etched to continue forming the apertures in the stack with the photoresist continuing to serve as a mask. At 2132, the apertures are etched into the organic polymer layer. The organic polymer layer can, for example, be dry etched with $O_2/N_2+CO$ and/or $O_2/N_2$ etchant compositions.

At 2136, the conductivity facilitating layer is etched. At 2140, the first conductivity layer is etched and the remaining photoresist portions are removed.

At 2144, a dielectric or insulating material deposited over the electrode, organic polymer, conductivity facilitating and conductive layers is applied. The dielectric material fills in the apertures formed into the electrode and organic polymer layers, and is formed to a height sufficient to be commensurate with subsequently formed wordline. The dielectric material can, for example, be formed to a height of about less than or equal to 2 μm. It will be appreciated that the dielectric may be applied in multiple stages. For example, the dielectric can initially be deposited at a low deposition rate with a conformal dielectric to fill in the apertures. The remainder of the dielectric can then be applied according to a faster deposition process such as, for example, spin coating, sputtering, thermal oxidation and nitridation of single crystal silicon and polysilicon, the formation of silicides by direct reaction of a deposited metal, chemical vapor deposition (CVD), physical vapor deposition (PVD), low pressure CVD (LPCVD), plasma enhanced CVD (PECVD), high density chemical plasma vapor deposition (HDCPVD), rapid thermal CVD (RTCVD), metal organic chemical vapor deposition (MOCVD) and pulsed laser deposition (PLD). The dielectric material can include, for example, silicon oxide (SiO), silicon dioxide ($SiO_2$), silicon nitride ($Si_3N_4$), (SiN), silicon oxynitride ($SiO_xN_y$), fluorinated silicon oxide ($SiO_xF_y$), polysilicon, amorphous silicon, tetraethyorthosilicate (TEOS), phosphosilicate glass (PSG), borophosphosilicate glass (BPSG), any suitable spin-on glass, polyimide(s) or any other suitable dielectric material.

At 2148, a second conductive layer is formed (e.g., for wordlines). At 2152, the second conductive layer is patterned with a photoresist. At 2156, the photoresist is developed. At 2160, the second conductive layer is etched. At 2164, the electrode layer is etched.

Next, at 2168, the organic polymer layer is etched and remaining photoresist portions are removed. At 2172, a dielectric material is applied.

It will be appreciated that a conductivity facilitating layer (e.g., $Cu_{2-x}S_y$, where x and y are chosen to provide the desired properties) employed in polymer memory cells plays an important role. Its presence significantly improves the conductivity of the organic polymer layer. This characteristic is at least partially a function of the following: charge carrier generated by $Cu_{2-x}S_y$, build up of a charge depletion layer, charge carrier distribution, and memory loss due to charge carrier redistribution after reversing electric field. The discussion infra describes and illustrates charge carrier concentration and behavior.

In the following example, a conductive polymer is implemented, and $Cu_{2-x}S_y$, (where x and y are chosen to provide the desired properties) is utilized a conductivity facilitating material. With respect to charge carrier generation, the copper in $Cu_{2-x}S_y$ is in a non-stioichiometric oxidation state: $1.8 \leq x \leq 2.0$). It has relatively strong capability to gain electrons from a conducting polymer and yields the following equation:

$$Cu_{2-x}S_y + Polymer \rightarrow Cu(I)S^- + Polymer^+ \quad (1)$$

The consequence is that an intrinsic field is produced due to the charges accumulated on the interface between $Cu_{2-x}S_y$ and polymer. This is shown in FIG. 24, which is a graph depicting the effect of an intrinsic electric field on an interface between $Cu_{2-x}S_y$ and a polymer is provided. The oxidized polymer (Polymer$^+$) is the charge carrier when external field is applied. The conductivity of polymer is determined by its concentration and its mobility.

$$\sigma = q\,p\mu \quad (2)$$

Where q is the charge of the carrier, p is carrier concentration and μ is the mobility.

Referring now to the charge depletion layer, employing a similar concept as applied with respect to semiconductors, a potential function can be expressed as:

$$V(x) = qN_p(d_p x - x^2/2)/\in \quad (3)$$

where $N_p$ is the average concentration of charge carrier, $\in$ is the dielectric constant of the polymer, and $d_p$ is the width of the charge depletion. $N_p$ can be obtained by employing the following equation:

$$d_p = \left[\frac{2\varepsilon(V_b \pm V)}{qN_p}\right]^{1/2} \quad (4)$$

where V is the external field voltage applied. For forward voltage, it is "−"sign. For the reverse voltage, it is "+" sign. The voltage function of Eq. (3) can be approximated to simplify the derivation.

With respect to charge carrier distribution, like p-doping of a semiconductor, two processes typically take place in the electric field. This flux can be expressed as:

$$J = -qD\frac{dp}{dx} + q\mu pE \quad (5)$$

where D is diffusion constant of the charge carrier, and E is the electric field at x. If there is no current, the carrier distribution is:

$$p(x) = p(0)\exp([(V(0)-V(x))/Vt]) \quad (6)$$

where p(0) is the concentration, V(0) is voltage at the interface respectively, and $V_t=kT/q$.

When forward voltage is so large that the current flux J>0, the analytical equation can be derived for steady state flow with some assumption for the voltage distribution in the cell. Overall, under forward voltage, the charge distribution p(x) is an increase function of x. When reverse voltage is applied, $V(x)>V_0$, the charge concentration is a decrease function of x.

The final characteristic, retention time, refers to the fact that a forward voltage produces more charge carrier and the charge carrier accumulates more on the other end of the passive ($Cu_{2-x}S_y$) layer (away from the polymer). However, this charge carrier concentration will be set back once the voltage is removed, which includes two processes: charge carrier diffusion toward the $Cu_{2-x}S_y$ layer and charge carrier recombination on the interface.

Fick's Law can describe the first process, charge carrier diffusion toward the $Cu_{2-x}S_y$ layer. The charge carrier recombination can be described as follows:

$$Cu(I)S^- + Polymer^+ \rightarrow Cu(II)S + Polymer \quad (7)$$

The retention time is the time required to redistribute the charge carrier to the original state. It is likely that the reaction rate is relatively faster than diffusion rate. Therefore, the retention time can be substantially determined by the diffusion process only.

An exemplary memory cell is considered herein with respect to the equations 1–9 discussed supra and illustrated in FIGS. 25–32. The exemplary cell is considered with parameters intrinsic voltage $V_b=0.02V$, equilibrium constant $K_{eq}=2.17\times10^{-4}$, concentration of $Cu_{2-x}S_y$ and Polymer at interface $[Polymer]_0=[Cu_{2-x}S_y]_0=10^{8^3}/cm^3$, polymer thickness $d=5\times10^{-5}$ cm (0.5 um), and CuS thickness $d_{cuS}=5\times10^{-7}$ cm (0.005 um). Six typical cases are calculated to illustrate electrical operation of an organic memory cell in accordance with an aspect of the present invention.

Figure 25:
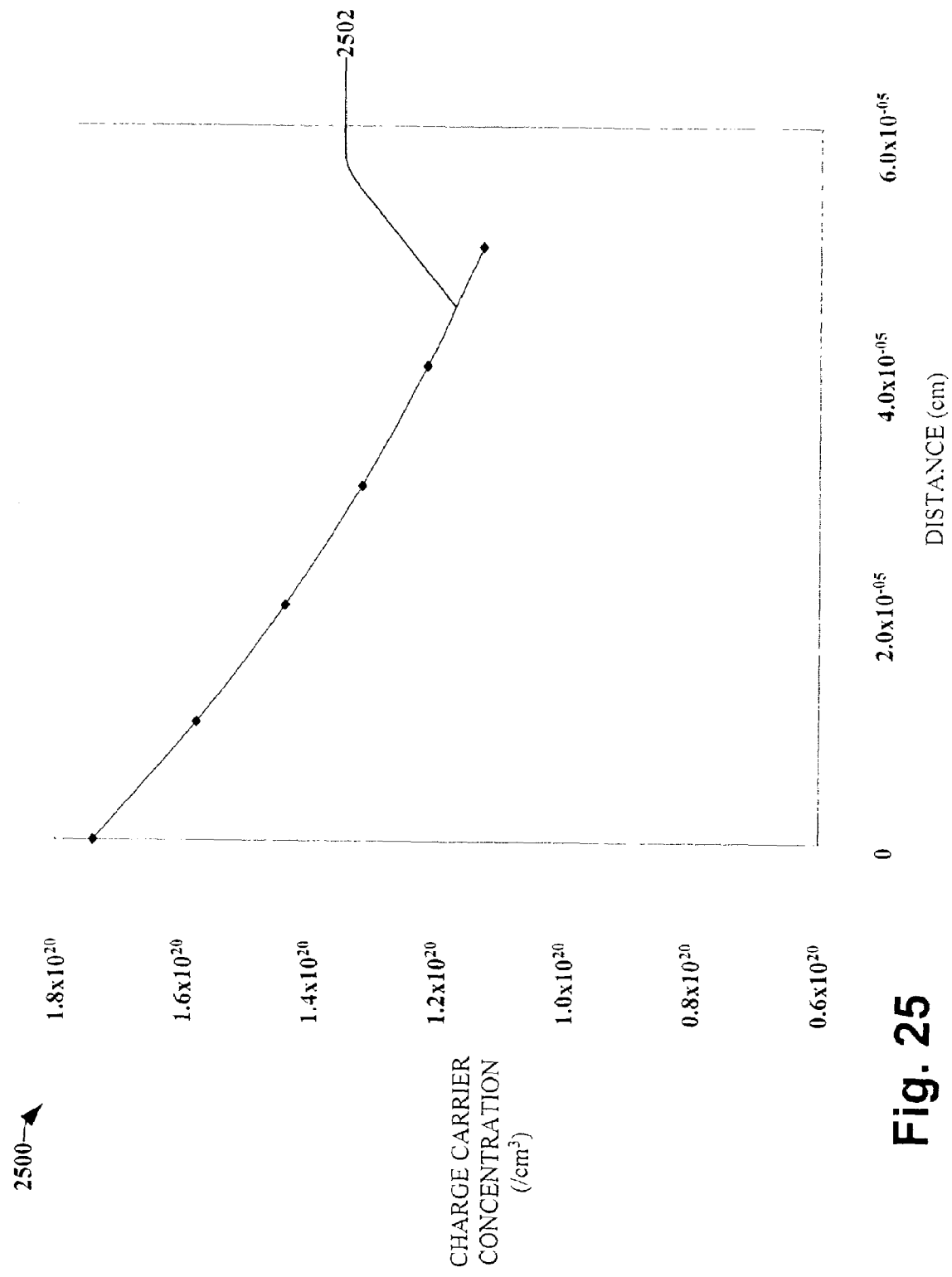
FIG. 25 is graph illustrating charge carrier distribution of an exemplary memory cell in accordance with one or more aspects of the present invention.

FIG. 25 depicts a graph 2500 of charge carrier distribution 2502 of the exemplary memory cell as a function of distance from the $Cu_{2-x}S_y$ and organic polymer interface in accordance with an aspect of the invention. The charge carrier concentration 2502 is shown as being a decreasing function of distance (x) from the interface. This graph 2500 assumes an external voltage V=0 and a current J=0. The charge carrier concentration 2502 is derived utilizing Eq. 6 with a constant field assumption. However, the points shown are independent of the constant field assumption.

Figure 26:
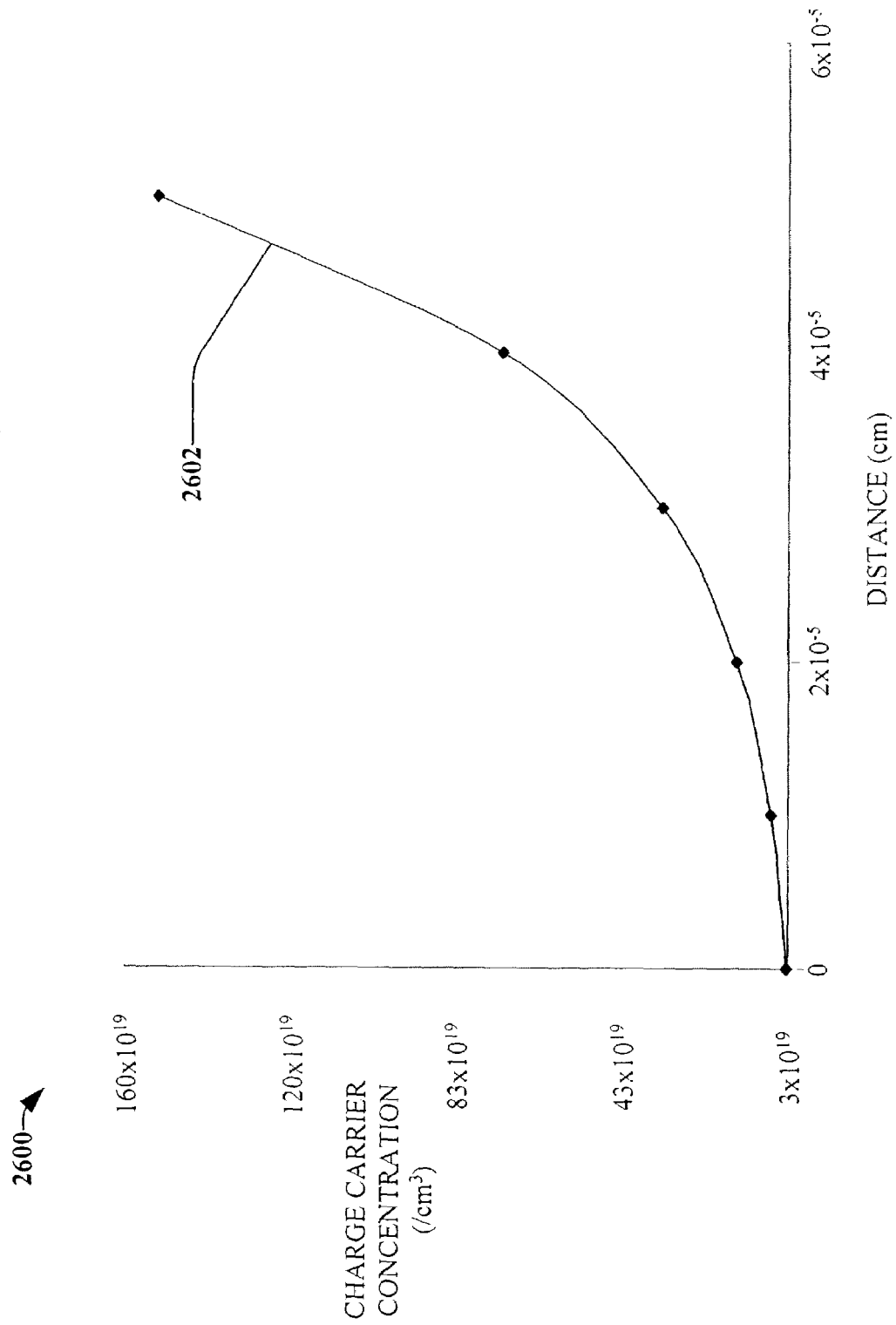
FIG. 26 is another graph illustrating charge carrier distribution of an exemplary memory cell in accordance with one or more aspects of the present invention.

Turning now to FIG. 26, another graph 2600 illustrating charge carrier distribution 2602 for the exemplary organic memory cell is depicted in accordance with an aspect of the present invention. For this graph 2600, parameters are set as follows: forward voltage=0.12V and current flux J=0. The $Cu_{2-x}S_y$ end has a higher voltage than the other end (organic polymer). This drives the charge carrier away from $Cu_{2-x}S_y$ layer and leads to charge carrier concentration that has an increase function of x. Even at lowest concentration p(0), it is not a small value for this case (e.g., its value is $3.32\times10^{19}/cm^3$ for the case shown in FIG. 26). This explains why the polymer is a good conductor when forward voltage is applied. Again, it is Eq. 6 with constant electric field model used for the plot. The points demonstrated are independent of constant electric field assumption.

Figure 27:
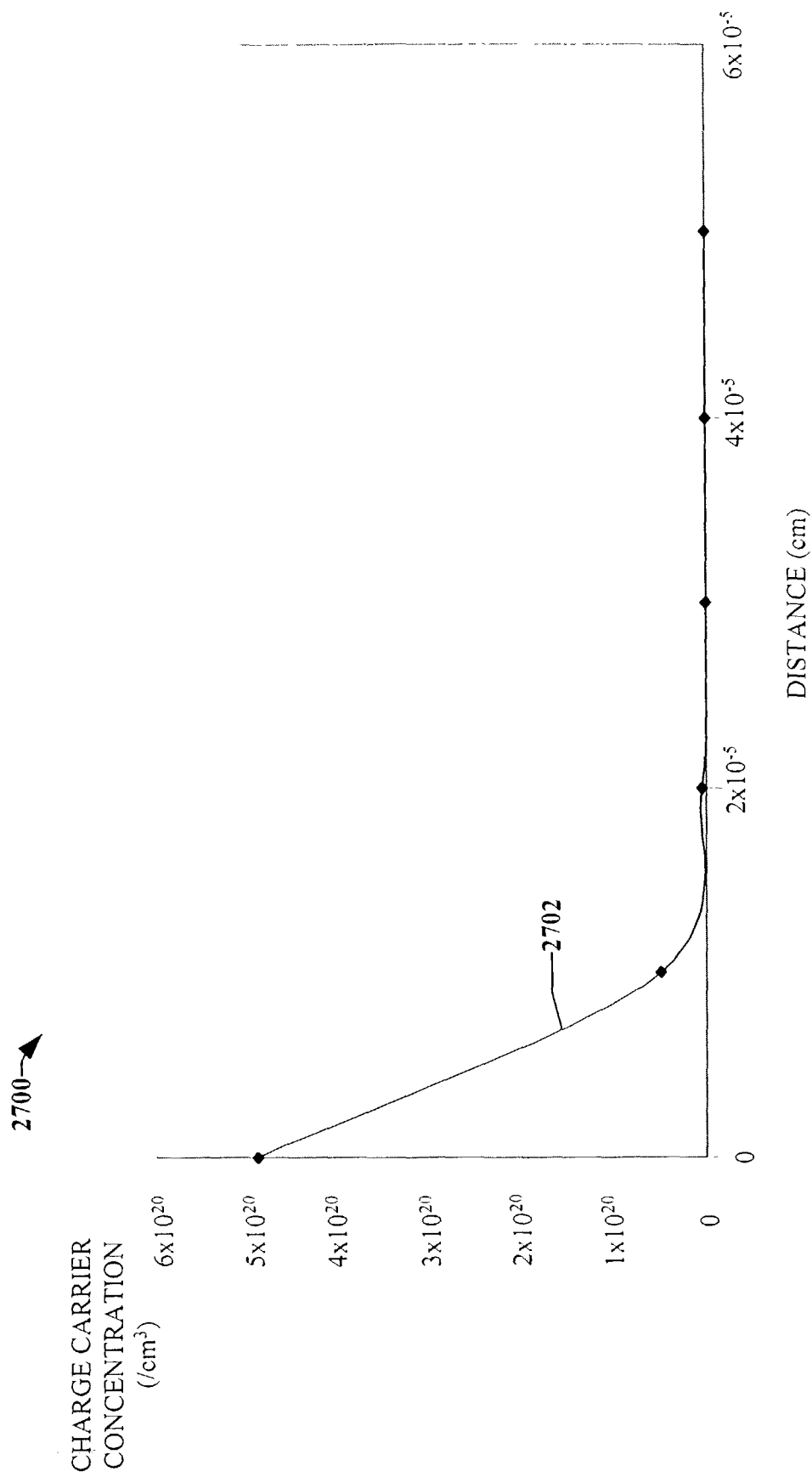
FIG. 27 depicts yet another graph illustrating charge carrier distribution of an exemplary memory cell in accordance with one or more aspects of the present invention.

FIG. 27 depicts yet another graph 2700 of charge carrier distribution 2702 of the exemplary memory cell as a function of distance from the $Cu_{2-x}S_y$ and organic polymer interface in accordance with an aspect of the invention. For this graph, the parameters are set such that the reverse voltage=0.28V and the current J=0. With reversed voltage, the charge carrier is concentrated at the $CU_{2-x}S_y$ polymer interface and drops quickly to small concentration when it is away from the interface, which describes why the memory cell becomes non-conductive when high reversed voltage applied. Again, Eq. 6 with constant electric field model is assumed for the plot. The points demonstrated are independent of this assumption.

Figure 28:
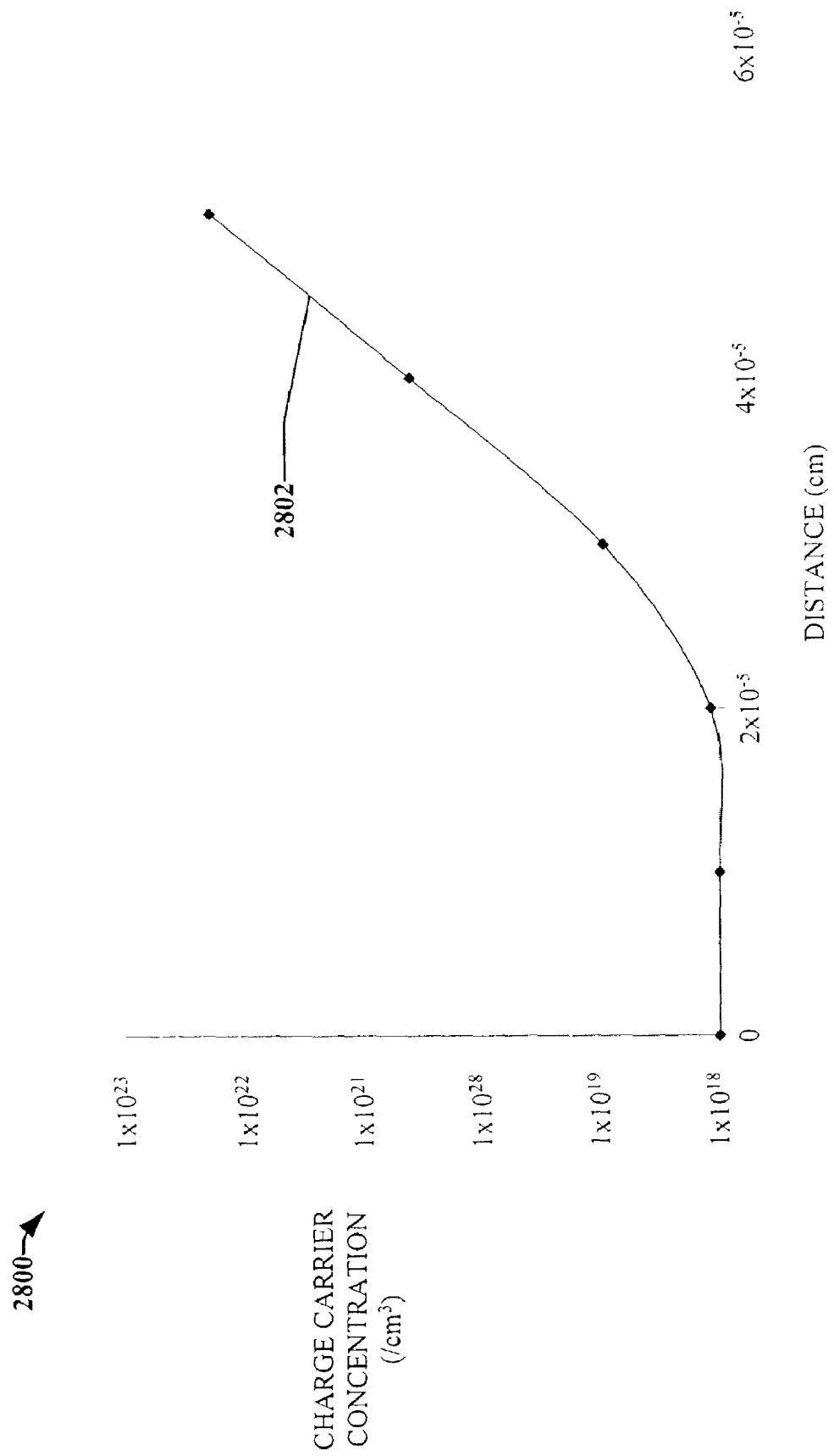
FIG. 28 is yet another graph illustrating charge carrier distribution of an exemplary memory cell in accordance with one or more aspects of the present invention.

Referring now to FIG. 28, another graph 2800 that depicts charge carrier distribution 2802 of the exemplary memory cell as a function of distance in accordance with an aspect of the present invention is provided. For this graph 2800, parameters are set as follows: forward voltage=0.52V and current flux $J>0(pj=10^{18}/cm^3)$. When current flux J>0, the charge carrier is still an increase function of x because the forward voltage drives the charge carrier away from $Cu_{2-x}S_y$ interface. One important point is that the lowest concentration p(x) is at interface.

Figure 29:
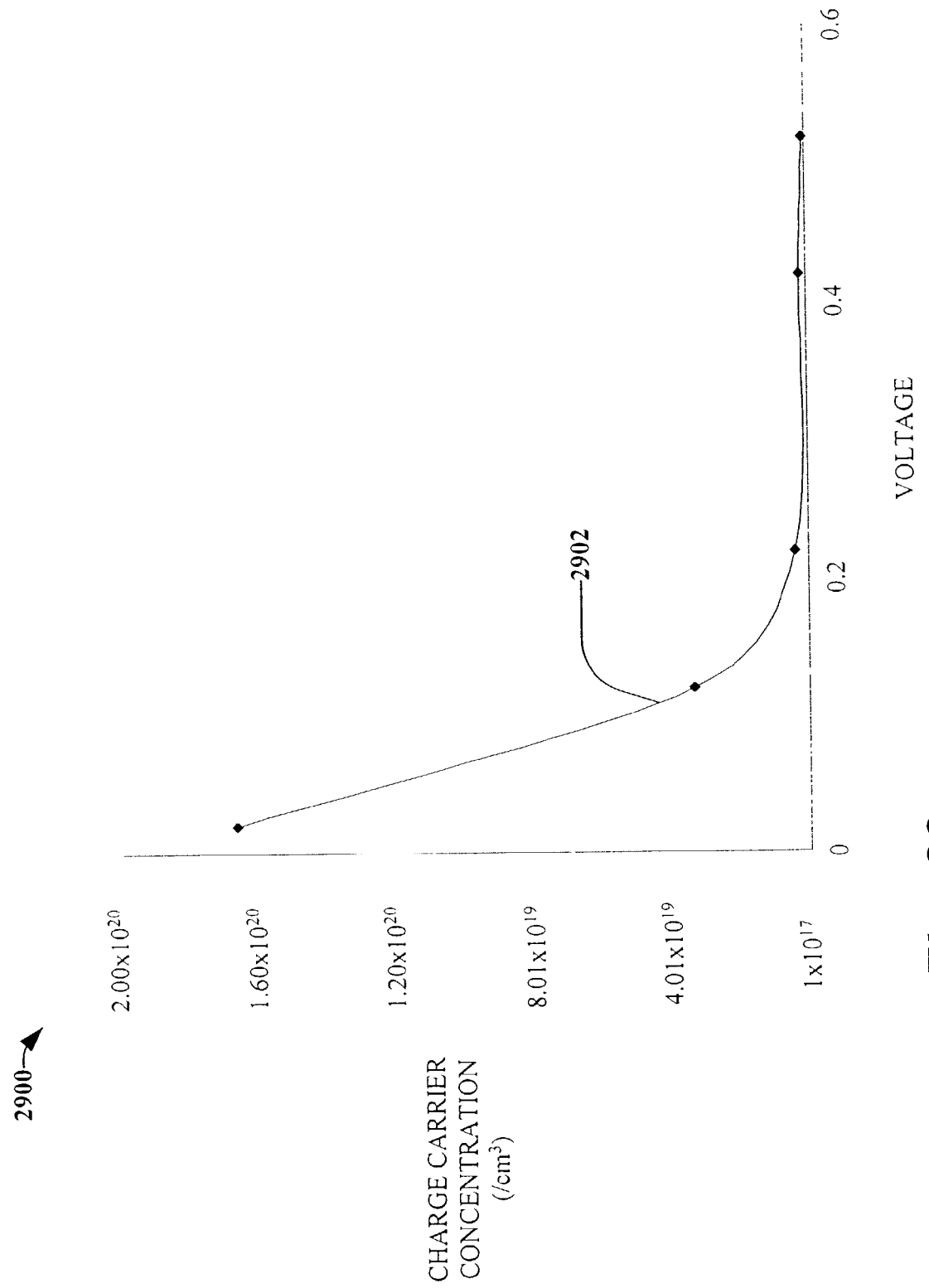
FIG. 29 is a graph illustrating charge carrier concentration at the interface of an exemplary memory cell in accordance with one or more aspects of the present invention.

FIG. 29 depicts yet another graph 2900 of charge carrier concentration at interface 2902 of the exemplary memory cell as function of forward voltage V. For this graph, the parameters are set such that $J>0(pj=10^{18}/cm^3)$ and assumes a constant electric field model. This model assumes the electric field in the cell is constant. Therefore, the voltage V(x) is described as a linear function. This model is applicable when the diffusion constant of the polymer is small and there is constant electric resistance. With this model, the charge carrier concentration at interface is derived as function of voltage. It is noted that $p_0(V)$ tends to be constant after forward voltage is large enough and the current is controlled by the charge carrier not charge injection at the interface. As such, p(0) can be rewritten as:

$$p(0) = \frac{1}{2}\left\{-K_{eq}[Polymer]_0 + \sqrt{(K_{eq}[Polymer]_0)^2 + \frac{4d_{CuS}K_{eq}[Polymer]_0[CuS]_0}{d}}\right\} \quad (10)$$

This Eq. 10 shows that limiting p(0) is an increase function of thickness ratio between $CU_{2-x}S_y$ layer and polymer layer.

Figure 30:
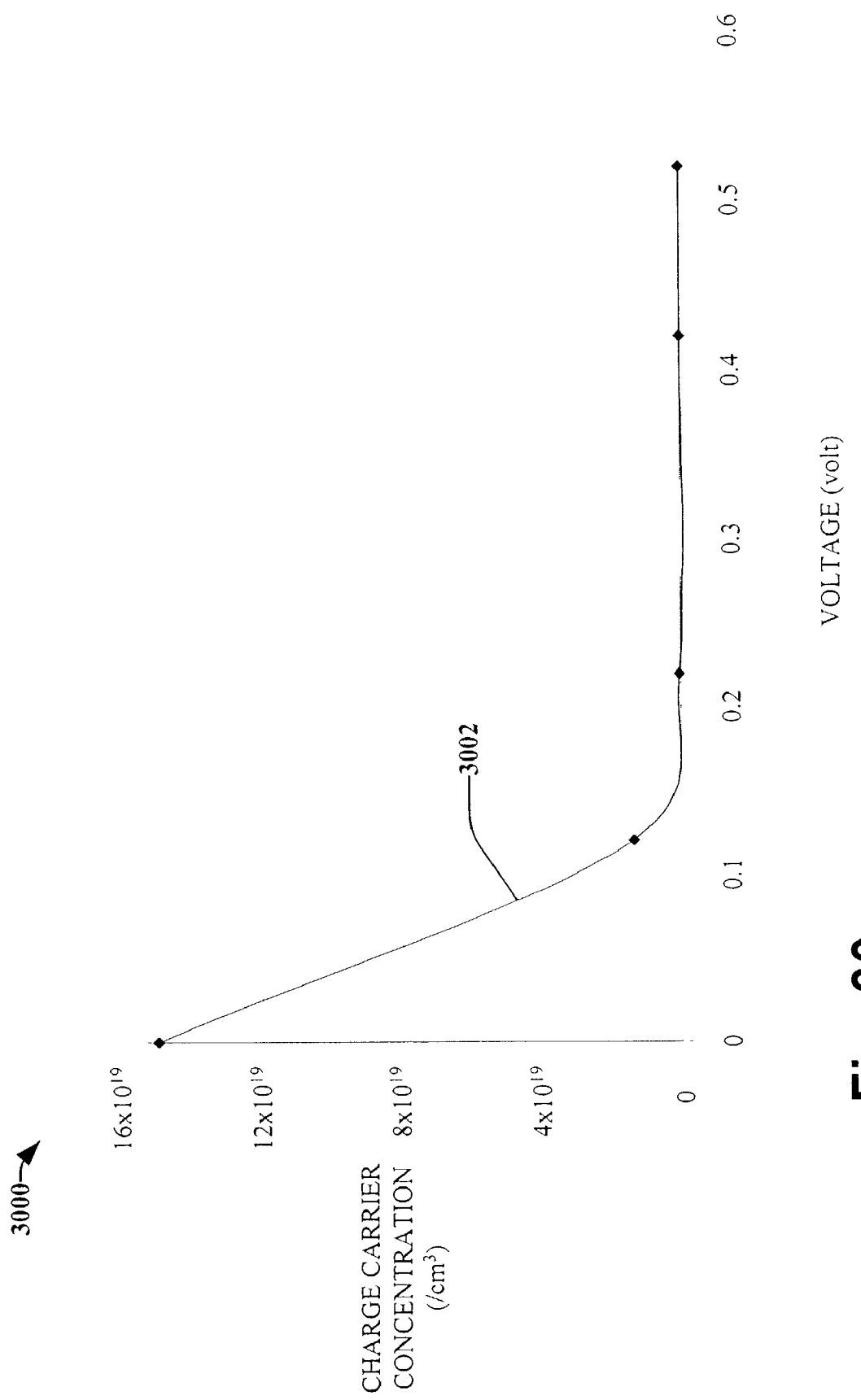
FIG. 30 is another graph illustrating charge carrier concentration at the interface of an exemplary memory cell in accordance with one or more aspects of the present invention.

FIG. 30 illustrates another graph 3000 that depicts charge carrier concentration at the interface 3002 of the exemplary memory cell as function of forward voltage $V_m$ accordance with an aspect of the present invention is provided. For this graph 100, p(0) is a function of forward voltage, current J, which may or may not be>0, and a step potential function model. This model assumes the voltage V(x) function can be described by a step function. The model is applicable when the diffusion constant of the polymer is very large. Therefore, the electric resistance in the cell is trivial. With this model, the charge carrier concentration at interface is derived as the function of voltage. It is noted that in FIG. 30 that $p_0(V)$ tends to be zero after forward voltage is large enough. When the charge carrier at the interface controls the current flux, this value is a function of voltage. This zero limit behavior is due to the interface boundary limit set by the reaction (1). Basically, the fast charge carrier transportation from the interface to the other end reaches the supply limit. Thus, the limiting p(0) is also rewritten as:

$$p(0) = \frac{1}{2}\left\{-K_{eq}[Polymer]_0 + \sqrt{(K_{eq}[Polymer]_0)^2 + \frac{4d_{CuS}K_{eq}[Polymer]_0[CuS]_0}{d\left[\exp\frac{V(0)-V}{V_t} - \frac{V(0)-V}{V_t}\right]}}\right\} \quad (11)$$

Again p(0) is an increase function of thickness ratio between $Cu_{2-x}S_y$ layer and polymer layer.

Regarding the above discussion, it is important to note that the flux measured is determined by charge carrier drift when limiting flux is in the polymer. Under constant electric field assumption, the function to describe the charge carrier concentration is p(x). pj=p(0) is met when the polymer determines limiting flux since the lowest concentration in the cell is at the interface. This condition results in a constant p(x). This means the diffusion contribution to the flux in Eq. 5 is zero. Under step potential assumption, another function is employed to describe the charge carrier concentration p(x). The initial charge carrier concentration p(0) has a relatively substantially smaller value than other regions. Therefore, J is still determined by p(0 ). Another point that is noted regards boundary conditions. Unlike semiconductors, it is just applicable to the concentration at interface, not everywhere. This boundary condition limits the total amount of the charge carrier produced in the cell.

The equations supra (Eqs. 1–7) and the FIGS. 27–30 describe and model behavior of polymer memory cells. This model can be employed to explain measured data and can be for other materials aside from $Cu_{2-x}S_y$. Additionally, the model can be used to think about how to improve retention and response time and to design the other devices such as transistors. Further, the model can be employed to develop various threshold voltages that set conductivity levels (e.g., set states), read conductivity levels and erase the conductivity levels thus performing memory device operations of writing or programming, reading and erasing.

What has been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. An organic memory device, comprising:
  a first conductive layer that serves as a bitline;
  an organic polymer layer over and in direct contact with at least part of the first conductive layer;
  an electrode layer over and in direct contact with the organic polymer layer;
  a second conductive layer that serves as a wordline over and in direct contact with the electrode layer; and,
  a dielectric material surrounding and in direct contact with at least a portion of the organic polymer layer and the electrode layer, at least some of the dielectric material applied after the second conductive layer has been applied and etched, etching of the second conductive laying facilitating self-alignment of the organic memory device.

2. The organic memory device of claim 1, the organic polymer layer having an impedance that can be selectively programmed to one of at least two states.

3. The organic memory device of claim 1, further comprising a conductivity facilitating layer over the first conductive layer and below the organic polymer layer, wherein the conductivity facilitating layer has relatively stable states that match the relatively stable states of the organic polymer layer.

4. The memory device of claim 3, the conductivity facilitating layer comprising at least one of copper sulfide ($Cu_{2-x}S_y$, CuS), copper oxide (CuO, $Cu_2O$), manganese oxide ($MnO_2$), titanium dioxide ($TiO_2$), indium oxide ($I_3O_4$), silver sulfide ($Ag_{2-x}S_2$, AgS), silver-copper-sulfide complex ($Ag_yCu_{2-x}S_2$), gold sulfide ($Au_2S$, AuS), cerium sulfate ($Ce(SO_4)_2$), ammonium persulfate (($NH_4)_2S_2O_8$), iron oxide ($Fe_3O_4$), lithium complexes ($Li_xTiS_2$, $Li_xTiSe_2$, $Li_xNbSe_3$, $Li_xNb_3Se_3$), and Palladium hydride ($H_xPd$), where x and y are selected to produce desired properties.

5. The organic memory device of claim 1, the organic polymer layer being a conjugated organic material.

6. The organic memory device of claim 1, the organic polymer layer being selected from the group comprising: polyacetylene, polyphenylacetylene, polydiphenylacetylene, polyaniline, poly(p-phenylene vinylene), polythiophene, polyporphyrins, porphyrinic macrocycles, thiol derivatized polyporphyrins, polymetallocenes, polyferrocenes, polyphthalocyanines, polyvinylenes, polypyrroles, polydiphenylacetylene and polystiroles.

7. The organic memory device of claim 1, the organic layer formed via a chemical vapor deposition process.

8. The organic memory device of claim 1, the organic layer formed via a gas phase reaction process.

9. The organic memory device of claim 1, the organic layer formed via a spin coating process.

10. The organic memory device of claim 1, the electrode layer comprising at least one of amorphous carbon, tantalum, tantalum nitride (TaN), titanium and titanium nitride (TiN).

11. The memory device of claim 1, the first conductive layer comprising at least one of copper, aluminum, chromium, germanium, gold, magnesium, manganese, indium, iron, nickel, palladium, platinum, silver, titanium, zinc, alloys thereof, indium-tin oxide, polysilicon, doped amorphous silicon, metal suicides, Hastelloy®, Kovar®, Invar, Monel®, Inconel®, brass, stainless steel and magnesium-silver alloy.

12. The organic memory device of claim 1, the dielectric material including at least one of silicon oxide (SiO), silicon dioxide ($SiO_2$), silicon nitride ($Si_3N_4$), (SiN), silicon oxynitride ($SiO_xN_y$), fluorinated silicon oxide ($SiO_xF_y$), polysilicon, amorphous silicon, tetraethyorthosilicate (TEOS), phosphosilicate glass (PSG) and borophosphosilicate glass (BPSG).

13. The organic memory device of claim 1, the organic polymer layer having a thickness of about 0.001 μm or more and about 5 μm or less.

* * * * *